United States Patent [19]

Craft

[11] 4,321,706

[45] Mar. 23, 1982

[54] FREQUENCY MODULATED PHASE-LOCKED LOOP SIGNAL SOURCE

[75] Inventor: Kingsley W. Craft, Woodinville, Wash.

[73] Assignee: John Fluke Mfg. Co., Inc., Mountlake Terrace, Wash.

[21] Appl. No.: 168,524

[22] Filed: Jul. 14, 1980

[51] Int. Cl.³ .................... H04B 1/04; H03B 3/04; H04L 27/12; H04L 27/20
[52] U.S. Cl. ................................. 375/59; 455/113
[58] Field of Search ................. 375/59, 64, 120; 455/112, 113

[56] References Cited

U.S. PATENT DOCUMENTS

| | | | |
|---|---|---|---|
| 4,052,673 | 10/1977 | Herzog | 455/112 |
| 4,068,198 | 1/1978 | Otto | 375/64 |
| 4,110,707 | 8/1978 | Giolma | 455/113 |
| 4,206,425 | 6/1980 | Nossen | 375/120 |

Primary Examiner—Howard Britton
Attorney, Agent, or Firm—Christensen, O'Connor, Johnson & Kindness

[57] ABSTRACT

A programmable phase-locked loop frequency synthesizer having a feedback path that includes a tuned discriminator circuit is frequency modulated by coupling a portion of the modulating signal into the feedback path to effect modulation at rates which exceed the bandwidth of the phase-locked loop and by utilizing a portion of the modulating signal to frequency modulate the phase-locked loop reference signal to effect modulation at rates within the bandwidth of the phase-locked loop. A digitally controlled phase shifter that forms a portion of the discriminator tuning circuits in effect divides the phase-locked loop tuning range into a series of relatively narrow centiguous frequency bands. Data, representing deviations in the discriminator characteristics for each of these frequency bands, are stored in an erasable programmable read only memory. As the phase-locked loop is tuned to a particular frequency, a microprocessor determines the associated frequency band, accesses the stored data appropriate to that frequency band and establishes the proper setting of the digitally controlled phase shifter. The accessed data is coupled to a multiplying digital to analog convertor to automatically adjust the level of the modulating signal so that the system exhibits relatively constant modulation characteristics for each frequency band within the tuning range of the phase-locked loop. Low distortion is achieved within each of the relatively narrow frequency bands by circuitry which reduces or eliminates amplitude variations within the feedback path that includes the discriminator circuit, band pass filtering within this feedback path, and a feed-forward circuit arrangement that prevents modulation components from adversely affecting the discriminator tuning circuits. Additionally, a gain switching arrangement that automatically reduces the gain of the feedback loop and the phase-locked loop gain ensures system stability for all operating and tuning conditions.

14 Claims, 6 Drawing Figures

| SUBBAND | FREQUENCY (MEGA HERTZ) | | CORRECTION FACTOR | STORED DAC. SIG. | STEPPED PHASE | PHASE CODE |
|---|---|---|---|---|---|---|
| 0 | 248.22 | 249.2699 | 1.092 | 521 | 90° | 10 |
| 1 | 249.27 | 250.3199 | 1.001 | 478 | 180° | 11 |
| ⋮ | ⋮ | ⋮ | ⋮ | ⋮ | ⋮ | ⋮ |
| 31 | 280.77 | 281.8199 | 1.004 | 479 | 0° | 01 |
| 32 | 281.82 | 282.8699 | 1.056 | 504 | 90° | 10 |
| 33 | 282.87 | 283.9199 | 1.223 | 584 | 180° | 11 |
| 34 | 283.92 | 284.9699 | 0.920 | 439 | 270° | 00 |
| 35 | 284.97 | 286.0199 | 1.013 | 484 | 0° | 01 |
| 36 | 286.02 | 287.0699 | 1.077 | 514 | 90° | 10 |
| ⋮ | | | | | | |
| 260 | 521.22 | 522.2699 | 0.935 | 446 | 90° | 10 |

Fig. 6.

FREQUENCY MODULATED PHASE-LOCKED LOOP SIGNAL SOURCE

BACKGROUND OF THE INVENTION

This invention relates to frequency modulated signal sources. More particularly, this invention relates to signal sources for supplying a frequency modulated signal at any one of numerous selectable carrier frequencies wherein the signal source includes a frequency discriminator that is tuned to the selected frequency and connected to supply a negative feedback signal that stabilizes and/or reduces the noise level of the signal source.

As is known in the art, various circuit arrangements have been proposed and utilized to supply a frequency modulated electrical signal. Regardless of the exact techniques utilized to generate the carrier signal and the circuit structure involved, the basic design objective is to realize an overall circuit arrangement which exhibits a linear relationship between the magnitude of the modulating signal and the frequency deviation caused by that signal (i.e., $\Delta f/v = k$; where v is the instantaneous value of the modulating signal, $\Delta f$ is the difference between the resulting frequency and the carrier frequency and k is a constant). With respect to a fixed frequency sinusoidal carrier signal having a radian frequency of $\omega_c$ and a sinusoidal modulating signal having a radian frequency of $\omega_m$, such a relationship results in the well-known frequency modulation expression $v_o = A \cos(\omega_c + M_f \cos \omega_m t)t$, where A is a constant and the modulation index or deviation ratio $M_f$ is equal to the maximum frequency deviation divided by the frequency of the modulating signal.

In many situations a signal source must provide a frequency modulated signal at a relatively large number of carrier frequencies that extend over a substantial frequency range and the problems associated with achieving a circuit design that satisfactorily realizes the above-noted linear modulation characteristic are greatly increased. In particular, inherent nonlinearities in the modulation characteristics associated with practical circuit realizations cause distortion of the modulated signal. When a large number of carrier frequencies must be accommodated, achieving an acceptable distortion level not only requires that the system modulation characteristic be substantially linear but also requires that the modulation characteristic be substantially invariant relative to the set of carrier frequencies of interest. Because all components and networks exhibit at least a certain degree of frequency dependence, prior art signal sources that provide satisfactory (eg, low-distortion) frequency modulation over a relatively wide range of carrier frequencies are often relatively complex.

Additional design constraints often compound the above-noted problems of designing relatively broadband, frequency modulated signal sources. For example, signal sources that serve as laboratory instrumentation and signal sources utilized in channelized communication equipment often must supply frequency modulated signals wherein the carrier frequency is a precise, selected value. Such signal sources must not only additionally exhibit substantial long-term and short-term frequency stability, but must often meet demanding noise requirements with respect to stochastic internal circuit noise and coherent noise such as that caused by nonlinear circuit operation and bias supply ripple. Moreover, remote programming or signal selection via a digitally encoded or analog control signal is often a desirable or necessary feature.

Prior art attempts to provide frequency modulated rf signal sources basically include circuitry wherein the modulating signal directly controls the operating frequency of various types or classes of tuned oscillators and arrangements wherein the carrier frequency is produced by a conventional oscillator arrangement and frequency modulation is induced by subsequent processing of the carrier signal. Generally, those circuits which directly control the frequency of a tunable signal source include variable reactance devices which are electrically coupled to the resonant circuit that determines the frequency of oscillation wherein the modulating signal is coupled to the variable reactance and thereby controls the signal frequency. For example, in one type of prior art arrangement the frequency of an active oscillator circuit is established by a mechanically-tuned resonant cavity and frequency modulation is induced by supplying the modulating signal to a varactor diode that is coupled to the resonant cavity. Since the coupling between the varactor diode and the resonant cavity does not detrimentally affect the relatively high Q of the cavity, this type of arrangement exhibits a relatively high signal to noise ratio and permits selection of precise carrier frequencies. However, selection of each desired carrier frequency requires manual adjustment of the mechanically-tuned cavity and concomitant adjustment of the electrical coupling between the varactor diode in order to provide a relatively constant modulation characteristic at each frequency of interest. Thus, such an arrangement may require fairly complex mechanical tuning devices. Further, because of the mechanical tuning requirement, it may not be possible to change such a signal source between accurately defined carrier frequencies as rapidly as desired or necessary and remote frequency programming is often either impractical or requires a complex control mechanism.

Arrangements in which a selectable frequency carrier signal is generated by a conventional variable frequency oscillator and frequency modulated within subsequent circuit stages are typified by systems in which a signal at the desired carrier frequency is supplied by a first signal source and mixed or heterodyned with a frequency modulated signal that is obtained by modulating a second signal source which operates at a substantially invariant center frequency. Although the heterodyned signal is band-pass filtered, the necessary nonlinear characteristic of the mixing stage of such a system causes the generation of substantial spurious signal components. Further, systems of this type that provide carrier frequencies extending over a relatively large frequency range (eg, one octave or more) are relatively complex and costly.

In situations that require remote frequency programming to enable selection of a desired carrier frequency from a large number of signal frequencies, signal sources that are commonly referred to as frequency synthesizers are often employed and several arrangements have been proposed for frequency modulating various types of frequency synthesizers. One type of frequency synthesizer that has found widespread application is known as a phase-locked loop system includes a voltage controlled oscillator (VCO) that is phase-locked to a reference signal to thereby cause the VCO to operate at a frequency that is a rational, mathematical function of the reference signal frequency, e.g., $f_{out} = N$-

$f_{ref}$, where N is a selectable integer that is established by a programmable frequency divider that forms a portion of the phase-locked loop feedback network and $f_{ref}$ is the of the reference signal.

Since most phase-locked loop networks are designed to exhibit a relatively wide bandwidth and the phase-locked loop operates to eliminate phase and frequency perturbations occurring at rates within the loop bandwidth, it has been necessary to develop various circuit arrangements for satisfactorily phase or frequency modulating phase-locked systems. One approach to frequency modulating such a system in effect combines two modulation paths, the first of which accommodates fm rates within the bandwidth of the phase-locked loop and the second of which accommodates fm rates greater than the phase-locked loop bandwidth. In one system of this type, modulation signals at fm rates within the bandwidth of the phase-locked loop modulate the oscillator that supplies the reference signal and modulation signals at fm rates outside of the bandwidth of the phase-locked loop are coupled to the frequency control terminal of the phase-locked loop voltage controlled oscillator. A second arrangement of this type also utilizes frequency modulation of the phase-locked loop voltage controlled oscillator for modulation signals outside the phase-locked loop bandwidth and accomodates fm rates within the phase-locked loop bandwidth by phase modulating the phase-locked loop phase detector. In this type of arrangement, modulation signals at rates less than the crossover frequency of the phase-locked loop are typically coupled to the input terminal of the loop filter via a conventional integrator circuit.

Although properly compensating the above-described arrangement to equalize the signal delay in the two modulation paths often provides satisfactory circuit operation, it is often difficult to obtain the previously mentioned linear, frequency invariant modulation characteristic over a desired range of carrier frequencies. Further, because the stochastic phase noise generated by state of the art voltage controlled oscillators is substantially higher than that of frequency modulated oscillators employing high Q resonant networks (e.g., a resonant cavity), prior art frequency modulated phase-locked loops have not satisfied the extremely demanding performance requirements such as those associated with high quality channelized communication systems and laboratory test equipment.

In this latter regard, the low noise signal source disclosed in a U.S. patent application of Donald G. Meyer, entitled "Controlled Frequency Source Apparatus Including a Feedback Path for the Reduction of Phase Noise", Ser. No. 168,065 filed of even date with this application and assigned to the assignee of this invention provides a phase-locked loop having remote signal selection capabilities, a frequency range of one octave or more, and substantially less phase noise than previously realizable phase-locked loop systems. However, the frequency modulation problems associated with more conventional prior art phase-locked loop frequency synthesizers are not overcome or alleviated by the arrangement disclosed in the referenced patent application by Meyer, but, in fact, become more complex. In particular, the low noise programmable divide-by-N phase-locked loop arrangements disclosed in the Meyer application not only include a feedback path for establishing and maintaining phase-lock at the selected signal frequency, but also include a second feedback path that reduces phase noise by, in effect, demodulating the VCO output signal and supplying negative feedback that is proportional to VCO phase noise to the VCO frequency control terminal. This additional feedback path includes a frequency discriminator of the type which includes a time delay network (e.g., a surface acoustic wave (SAW) delay device or a coaxial cable) that is serially interconnected between one input port of a phase detector and the output terminal of the VCO. Variable phase shifting apparatus, included in one or both of the phase detector input paths, is automatically controlled in response to the signal provided by the phase detector and/or the system frequency selection signal so as to maintain the phase detector output signal substantially equal to zero at each selected frequency of operation (i.e., at phase-lock). Thus, the frequency discriminator effectively tracks the phase-locked loop to provide negative feedback to the VCO frequency control terminal and, by properly configuring the system, low phase noise is attained without significantly altering frequency selection (tuning) characteristics. However, high quality, low-distortion frequency modulation of such a signal source at each selected frequency over a relatively wide frequency range is inherently difficult in such a system because ideal, frequency invariant amplitude and phase (delay) characteristics cannot be attained in either the feedback path for maintaining phase-lock or the feedback path for reducing phase noise. In fact, since the amplitude and delay characteristics of stepped phase shifters and switched delay networks that are used in some embodiments of the system disclosed by Meyer are discontinuous functions of frequency, the phase-locked loop signal sources disclosed in the referenced Meyer patent application are not capable of accurate frequency modulation by direct application of prior art techniques.

Accordingly, it can thus be recognized that the prior art has provided numerous frequency modulated signal sources but, prior to this invention, has not provided a signal source which simultaneously satisfies design objectives and constraints associated with the more demanding signal source requirements. As previously mentioned, such signal source requirements include accurate, low-distortion phase or frequency modulation of numerous selected carrier frequencies that extend over a relatively wide frequency range, low noise, electronic tuning (frequency programming) and high reliability.

In the broadest sense it is thus an object of this invention to provide a frequency modulated signal source which permits remote selection of a single carrier frequency from numerous carrier frequencies that extend over a relatively wide bandwidth.

It is another object of this invention to provide a phase-locked loop signal source which can be frequency modulated at each of the synthesized signal frequencies.

It is yet another object of this invention to provide an improved phase-locked loop frequency synthesizer for supplying a low-noise frequency modulated signal.

Still further, it is an object of this invention to provide a means for accurate frequency modulation of a low-noise, phase-locked loop frequency synthesizer of the type disclosed in the previously-referenced patent application by Meyer.

SUMMARY OF THE INVENTION

These and other objects are achieved in accordance with this invention by arranging a low noise signal source of the general type disclosed in the previously-referenced patent application of Meyer to, in effect, divide the range of output frequencies into a set of relatively narrow, contiguous subbands and by augmenting the signal source with circuitry that automatically adjusts the level of an applied modulation signal so that a given modulation level provides a predetermined frequency deviation at the center frequency (or some other convenient point) of each subband. Circuitry is also included to compensate for frequency-dependent gain variations throughout the subbands to thereby provide accurate, low distortion frequency modulation over the entire output range of the signal source. Additionally, the frequency modulated signal source of this invention is arranged to prevent the modulation signal from reaching portions of the noise-reducing circuit that maintain the average value of the frequency discriminator phase detector output signal substantially equal to zero at the desired carrier frequency. Further, the preferred phase-locked loop embodiments of the invention include circuitry for improving signal acquisition or tuning time and ensuring that the system is unconditionally stable under all possible operating states including turn on and transient conditions.

In each disclosed embodiment of the invention, the carrier signal is supplied by a signal source configured in accordance with the broader aspects of the previously-referenced patent application of Meyer so that a portion of the output signal provided by a voltage controlled oscillator (VCO) is coupled to the VCO frequency control terminal via a feedback path which includes a frequency discriminator network and an amplifier circuit. The frequency discriminator network includes a phase detector network wherein the VCO output signal is coupled to both input ports of the phase detector with a time delay network being interconnected in one of the circuit paths to cause a phase difference $\omega\tau$ between the phase detector input signals, where $\omega$ is the frequency of the VCO in radians/second and $\tau$ is the time delay. The discriminator network also includes a stepped phase shifter and a variable phase shifter that are connected in either or both of the two phase detector input paths and are operable to collectively provide the amount of phase shift required to cause the discriminator frequency vs. output characteristic to be substantially equal to zero at each selected carrier frequency. More specifically, in each of the embodiments disclosed herein, the stepped phase shifter operates in response to a digitally encoded signal that is derived from the system frequency selection signal to provide a phase shift of $\phi_s = 2\pi m/k$, where k is a preselected positive integer and $m = 0, 1, \ldots, (k-1)$. The variable phase shifter of each disclosed embodiment exhibits a phase shift range of at least $2\pi/k$ with the amount of phase shift inserted in the system being determined by an analog signal that is supplied by a phase shifter control circuit which is interconnected between the output of the frequency discriminator and a control terminal of the variable phase shifter.

Configured in this manner, the output voltage vs frequency characteristic of the discriminator is substantially equal to $K_d \cos(\omega\tau \pm \phi_s \pm \phi_e)$, where $K_d$ is a constant, $\phi_e$ is the phase shift provided by the variable phase shifter and the algebraic sign of the phase shift provided by the stepped phase shifter depends on which of the two phase detector input paths includes the stepped phase shift. Regardless of the exact configuration employed, the frequency discriminator "zero-phase characteristic" (the output voltage vs frequency characteristic of the discriminator when $\phi_s = \phi_e = 0$) exhibits a period of $1/\tau$ with zero crossings of positive going portions of the discriminator characteristic being located at frequencies of $(4n-1)/(4\tau)$ and zero crossings within negative going portions of the discriminator characteristic being located at frequencies of $(4n-3)/(4\tau)$, where $n = 1, 2, 3 \ldots$. Thus it can be recognized that incrementing the stepped phase shifter in steps of $2\pi/k$ radians shifts or moves each zero crossing of the discriminator characteristic by a frequency increment of $1/(k\tau)$ and appropriate control of the stepped phase shifter places a zero crossing within the negative or positive going portions of the discriminator characteristic within $1/(2k\tau)$ hertz of the signal frequency supplied by the VCO. Since the variable phase shifter is automatically controlled in response to the discriminator output signal and exhibits a phase shift range of at least $2\pi/k$, appropriate control of the stepped phase shifter (i.e., selection of the proper $m = 0, 1, 2, \ldots, (k-1)$) will cause a zero crossing of the discriminator characteristic to coincide with the selected VCO frequency.

As shall be described in more detail relative to various embodiments of the invention disclosed herein, the above-discussed arrangement in effect subdivides the frequency range of the VCO into relatively narrow contiguous subbands wherein each subband is associated with a particular crossover of the frequency discriminator zero-phase characteristic (i.e., the discriminator characteristic when $\phi_e = \phi_s = 0$). Each of the disclosed embodiments of the invention include a frequency selective feedback path that causes the system to operate as a phase-locked loop frequency synthesizer with both the frequency selection path and the noise-reducing discriminator path being arranged to meet constraints set forth in the previously-mentioned patent application of Meyer that are necessary to achieve maximum phase noise performance and conventional phase-locked loop tuning capabilities.

To achieve low distortion FM modulation over a wide frequency band (e.g., an octave or more), each embodiment of the present invention couples a first modulation signal into the noise-reducing discriminator path to modulate the discriminator and a second modulation signal to an additional VCO (e.g., a crystal-controlled reference voltage controlled oscillator), that provides the phase-locked loop reference signal. In this regard, the first modulation signal is thus summed with the loop feedback and, because of the high pass characteristics of the pase-locked loop is primarily effective at frequencies outside the effective loop bandwidth. Since the system VCO effectively tracks the reference oscillator for all frequencies within the phase-locked loop bandwidth, the second modulation signal provides low frequency modulation, with the combined effect of the two modulation signals ideally providing a flat frequency response that is independent of loop cutoff frequency.

Maintaining frequency modulation that is a faithful reproduction of the modulation source through use of the above-discussed two modulation components requires proper delay equalization of the modulating signals and, more importantly, requires that the modulation coefficients associated with each modulation path are relatively invariant over the range of carrier frequencies being employed. In this respect, this invention attains relatively constant modulation coefficients over a substantial frequency band by compensation of the modulation signals on the basis of the carrier frequency and the subband with which that carrier frequency is associated. In particular, because the output frequency of the VCO is related to the loop reference frequency by N, where N denotes the frequency division factor for the phase-locked loop, the modulation sensitivity for frequencies below the loop cutoff frequency is proportional to N. On the other hand, variations in the modulation sensitivity for frequencies greater than the loop bandwidth are primarily determined by the changes in the slope and linearity of the discriminator utilized in the noise-reducing feedback path. Since the various circuit components utilized in the discriminator each exhibit phase and/or amplitude variations relative to frequency, the overall discriminator characteristic varies substantially and unpredictably over the system bandwidth.

In accordance with the invention, compensation of the modulation component within the loop bandwidth is effected by multiplying the modulation component by 1/N, whereas compensation of the modulation component for modulation rates greater than the loop bandwidth utilizes a separate multiplicative compensation factor for each of the subbands that comprise the system bandwidth. Further, because of component tolerances and other factors, the compensation or equalization factors associated with the subbands of one particular realization of the invention will not be identical to those required for another realization utilizing the same circuit arrangement. Thus, in accordance with the invention, the discriminator equalization characteristics are determined for each unit that is constructed and provision is made for reestablishing the compensation factors upon replacement of system components within the discriminator path or should recalibration become necessary.

In the disclosed embodiment of the invention, the compensation factors are stored in an erasable random access memory (EPROM) within a conventional microprocessor arrangement that is activated by the system frequency selection signal. The microprocessor determines both the value of N and the subband associated with each particular selected frequency and addresses the correction factor stored in the EPROM for the subband associated with the selected frequency. In addition, digitally-encoded signals representing both N and the stored correction factor are coupled to the digital signal ports of multiplying-type digital-to-analog converters (DAC's) having the analog input terminals thereof connected for receiving the modulation signal. The output terminals of the respective DAC's are coupled to the frequency control terminal of the voltage-controlled reference oscillator and to the gain unit of the previously-discussed noise-reducing discriminator feedback path. Thus, compensation is effected on a per subband basis, thereby reducing modulation inaccuracies to those which occur over a relatively narrow frequency range, rather than those associated with the entire system bandwidth.

In the presently preferred embodiment of the invention, additional compensation is provided to at least partially eliminate variations in the modulation coefficient within each of the relatively narrow subbands. In this regard, the discriminator characteristics are maintained substantially constant throughout each of the subbands by judicious impedance matching and by a circuit arrangement that compensates the signal within the noise-reducing discriminator path so as to maintain a relatively constant level at the signal (linear) input port of a doubly-balanced mixer, which serves as the phase detector of the noise-reducing discriminator feedback path. In addition, the presently preferred embodiment of the invention includes a circuit arrangement for accessing the proper frequency subband while simultaneously ensuring that the system is unconditionally stable each time the system is initially energized or a new frequency is selected that lies within a different subband. In the disclosed arrangement, this signal acquisition circuitry includes a voltage comparator that activates a monostable multivibrator each time the system is tuned to a frequency that corresponds to the uppermost or lowermost frequency of a subband. The monostable multivibrator activates switching devices which attenuate the feedback signal supplied by the discriminator and simultaneously controls the system band pass so as to maintain a substantially constant loop bandwidth. Further, the signal provided by the monostable multivibrator preferably activates an additional switch that interrupts (removes) the modulation signal to prevent modulation from reaching and interfering with the signal controlling the discriminator path variable phase shifter during each signal acquisition.

BRIEF DESCRIPTION OF THE DRAWINGS

Other objects and advantages of the present invention will become apparent to one skilled in the art after reading the following description taken together with the accompanying drawing, in which:

FIG. 6 is a table that includes data representing a particular frequency synthesizer unit constructed in accordance with the embodiment of FIG. 5.

DETAILED DESCRIPTION

Figure 1:
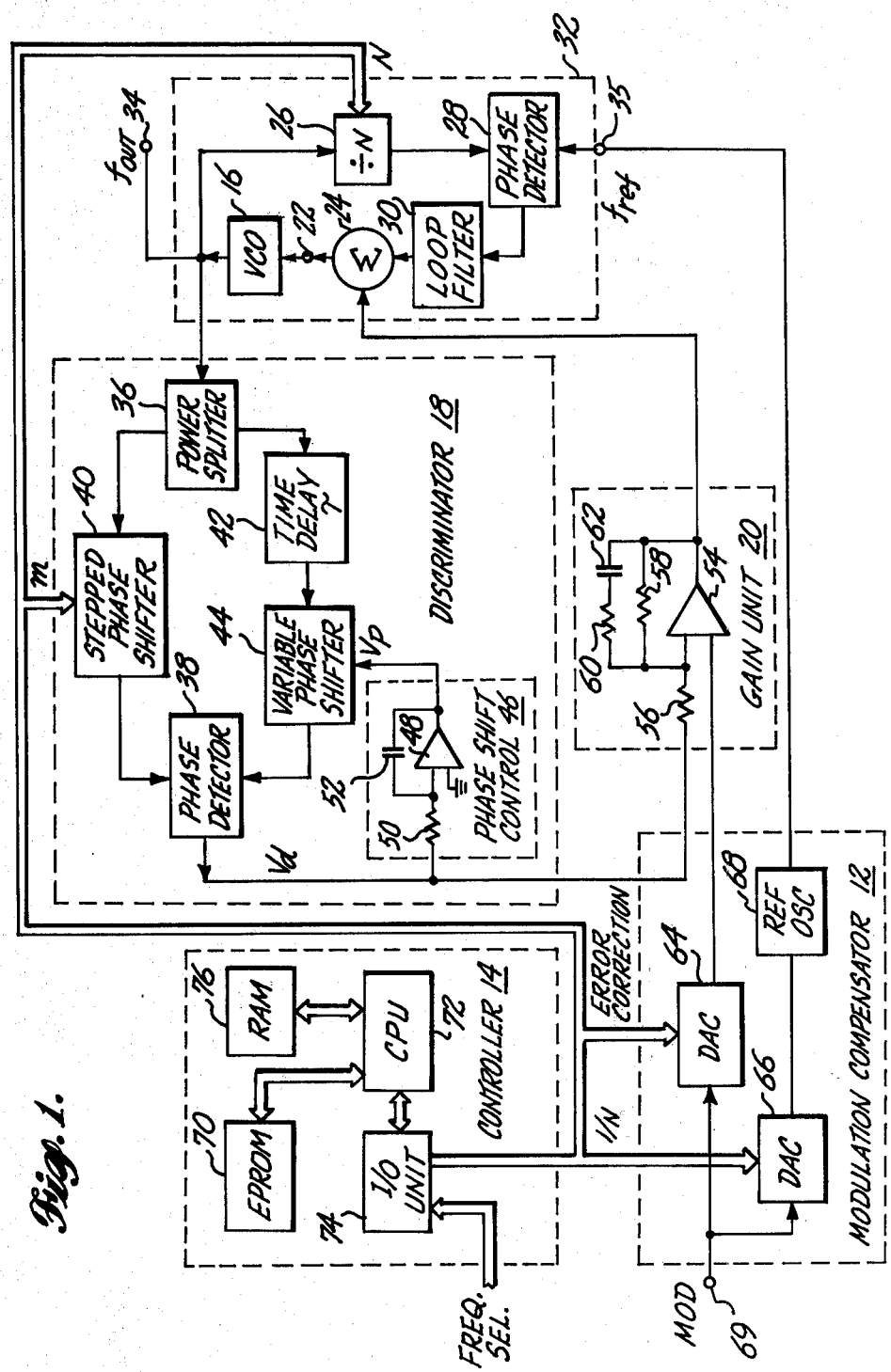
FIG. 1 is a block diagram of a basic arrangement of the present invention.

With reference to FIG. 1, the basic arrangement of this invention includes a low noise phase-locked loop system that is configured in accordance with the previously-mentioned patent application of Donald L. Meyer; a modulation compensator unit 12, which is responsive to an applied modulation signal and supplies two separate modulation signals to different circuit nodes within the low noise phase-locked loop; and a controller 14, which controls the operation of both the phase-locked loop and modulation compensator 12 on the basis of an applied frequency selection signal. As shall be described in detail in the following paragraphs, the arrangement of FIG. 1 provides a wideband signal source wherein the system bandwidth is, in effect, partitioned into a plurality of contiguous subbands, having modulation characteristics that differ from one another because of component tolerances and other practical considerations. Based on the applied frequency selection signal, controller 14 determines the appropriate frequency subband and activates the low noise phase-locked loop to access that particular subband and, more specifically, the particular desired frequency within the accessed subband. To provide accurate and flat modulation throughout the system bandwidth, controller 14 supplies modulation compensator 12 with two correction signals which are dependent upon the frequency selected and the subband associated with that frequency. These two correction signals establish the level of the two modulation components that are coupled to the phase-locked loop so as to substantially eliminate the differences between the modulation characteristics of the various subbands and effect a relatively constant deviation ratio at all carrier frequencies within the range of the phase-locked loop system.

The low phase noise phase-locked loop portion of the embodiment depicted in FIG. 1 includes a voltage-controlled oscillator (VCO) 16 that augmented with two feedback paths wherein the first feedback path includes a discriminator network 18 for reducing phase noise generated within VCO 16 and the second feedback path, in effect, configures the thusly-modified VCO 16 into a phase-locked loop system of the type frequently used as a frequency synthesizer. More specifically, in the illustrative embodiment of FIG. 1, discriminator 18 of the noise-reducing feedback path is connected in cascade with a gain unit 20 and couples negative feedback from the VCO output terminal to a VCO frequency control terminal 22 via a conventional summing unit 24. The second feedback path (typically referred to herein as the frequency selection feedback path) includes a programmable frequency divider 26, which is connected between the output terminal of VCO 16 and one input port of a phase detector 28, and a low-pass filter network 30 that is connected between the output port of phase detector 28 and the second input port of summing unit 24.

As is known in the art, the above-mentioned arrangement of VCO 16, frequency divider 26, phase detector 28 and filter 30 (i.e., the components of the depicted system enclosed within dashed lines 32 of FIG. 1) form a conventional programmable divide-by-N phase-locked loop system wherein the frequency of the signal provided by VCO 16 to the system output terminal 34 is $Nf_{ref}$, where N is the divisor of frequency divider 26 and $f_{ref}$ is the frequency of a reference signal that is coupled to the second input port of phase detector 28 (via terminal 35 in FIG. 1). As is indicated in FIG. 1, to provide remote frequency programming, the divisor N is coupled to frequency divider 26 as a conventional digitally-encoded binary signal.

In the depicted arrangement, discriminator 18 of the noise-reducing feedback path includes a conventional power splitter 36 which divides the signal provided by VCO 16 between two circuit paths that are connected to the input ports of a phase detector 38. Since one of the circuit paths includes a stepped phase shifter 40 and the second circuit path includes a time delay unit 42 and a variable phase shifter 44 that are connected in cascade with one another, it can be shown that the phase difference between the signals supplied to phase detector 38 is equal to $\omega\tau + \phi_e - \phi_s$, where $\omega$ is equal to the frequency of the signal supplied by VCO 16 in radians/second, $\tau$ is the time delay associated with time delay unit 42 (in seconds) and $\phi_e$ and $\phi_s$ are respectively equal to the phase shift provided by variable phase shifter 44 and stepped phase shifter 40 (in radians). Thus, when phase detector 38 is of the type conventionally employed in phase-locked loop circuits (i.e., a doubly-balanced signal mixer or one of the various conventional devices that approximate an ideal multiplier circuit), it can be recognized that the signal, $V_d$, provided to gain unit 20 by phase detector 38 is given by the expression $V_d = K_d \cos(\omega\tau + \phi_e - \phi_s)$.

Discriminator 18 also includes a phase shifter control unit 46 which receives the signal provided by phase detector 38 ($V_d$) and supplies a signal to a control port of variable phase shifter 44 to thereby establish the phase shift $\phi_e$. In this regard and as shall be described in more detail hereinafter, the phase shift $\phi_e$ provided by variable phase shifter 44 is substantially equal to $K_s V_p$, where $V_p$ is the signal provided by phase shifter control 46 and in conjunction with the phase shift provided by stepped phase shifter 40 causes the signal, $V_d$, provided by phase detector 38 to be substantially equal to zero at each frequency selected through operation of the frequency selection loop. As is illustrated in FIG. 1, one arrangement for realizing a satisfactory phase shifter control 46 which provides a suitable dc control signal to variable phase shifter 44 is a conventional integrator circuit including an operational amplifier 48, an input resistor 50 and a feedback capacitor 52.

To complete the depicted noise-reduction feedback path, the output signal provided by phase detector 38 of discriminator 18 is connected to a first input terminal of an operational amplifier 54 of the depicted gain unit 20 via a resistor 56. A feedback network, which includes a resistor 58 that is connected in parallel with serially-connected resistor 60 and capacitor 62 is connected between the output and first input terminal of operational amplifier 54. As shall be discussed in more detail herein, the second input terminal of operational amplifier 54 receives a signal from modulation compensator 12 that establishes modulation at rates outside the phase-locked loop bandwidth and the output terminal of operational amplifier 54 is connected to the first input port of summing unit 24 to thereby couple a combined noise reduction-modulation signal into the phase-locked loop system.

In turning now to the operational aspects of the above-discussed low phase noise phase-locked loop arrangement and the basic considerations which relate to frequency modulation of such a system, it should be noted that both the structural and operational considerations of the low phase noise phase-locked loop are set forth in detail in the previously-referenced patent application of Donald L. Meyer. Accordingly, such description is incorporated by reference thereto and the discussion contained herein is limited to the basic features of the phase-locked loop, including these modifications and aspects essential to the disclosure of this invention.

First, relative to reducing system phase noise, it can be shown that substantial noise reduction will occur as long as the feedback path defined by discriminator 18 and gain unit 20 is configured to establish an output phase-input voltage relationship that can be approximated by the following expression $$\frac{\phi_0(s)}{V_i(s)} = \frac{K_v(s + \omega_0)(s + \omega_2)}{ss^2 + s(\omega_0 G_0 + \omega_2) + \omega_0\omega_2}$$

where s denotes the Laplacian operator; $\phi_0$ represents the phase of the output signal provided by VCO 16; $V_i(s)$ denotes an error signal injected into summing unit 24 with the frequency selection and modulation paths open-circuited (i.e., no signal being provided to summing unit 24 by filter 30 and no signal being coupled to gain unit 20 by modulation compensator 12); $K_v$ is the gain factor of VCO 16 (in radians/volts x seconds); $G_0$ is a gain factor associated with the particular arrangement of discriminator 18 and gain unit 20 being employed; and $\omega_0$ and $\omega_2$ are singularities defined by the arrangement of discriminator 18 and gain unit 20. When the system is arranged so that $\omega_0 G_0$ is substantially greater than $\omega_2$, the output phase VCO frequency control relationship becomes substantially identical to $$\frac{\phi_0(s)}{V_i(s)} = \frac{K_v(s + \omega_0)(s + \omega_2)}{s(s + \omega_0 G_0)(s + \omega_2/G_0)} \quad (1)$$

As is fully demonstrated in the previously referenced patent application of Meyer, an arrangement of discriminator 18 and gain unit 20 of the type depicted in FIG. 1 results in the following parametric expressions for $G_0$, $\omega_0$ and $\omega_2$ of Equation 1:

$\omega_0 = 1/(R_{58}C_{62})$
$\omega_2 = K_d K_s/(R_{50}C_{52})$ and
$G_0 = K_v K_d \tau A_0 + 1$, where $A_0$ is the dc gain of gain unit 20, i.e., $R_{58}/R_{56}$.

As is also described in the patent application of Meyer, since various time delay devices such as coaxial cables and surface acoustic wave (SAW) devices that are preferably used as time delay 42 in circuits intended for high frequency operation (e.g., in the UHF region of the frequency spectrum) exhibit a sine x/x relationship (where x is proportional to $\omega\tau$) and optimum low noise operation requires that $\omega_0 G_0 = \pi/\tau$, the preferred embodiment of the low phase noise phase-locked loop arrangement often requires realization of an additional circuit zero at $\omega = \pi/\tau$ to improve circuit phase margin and partially compensate for loss in discriminator circuit gain that would otherwise occur. In the arrangement of FIG. 1, this circuit zero is established by capacitor 62 and resistor 60 by selecting component values such that $1/(R_{60}C_{62})$ is substantially equal to $\pi/\tau$.

With respect to frequency divider 26, phase detector 28 and filter 30, which form the frequency selection feedback path for phase-locking VCO 16 to the reference signal supplied to terminal 35, low noise operation of the circuit of FIG. 1 is accomplished while simultaneously maintaining conventional phase-locked loop tuning characteristics if the circuit components of the depicted arrangement are selected so that $\omega_2 < \omega_3/G_0 < \omega_0$, where $\omega_3$ is equal to the bandwidth of the depicted phase-locked loop arrangement when the noise-reducing feedback path is open-circuited. That is, $\omega_3$ corresponds to the bandwidth of the conventional phase-locked loop contained within dashed outline 32, which is known to be $K_v K_\phi/N$, where $K_\phi$ is the transfer constant associated with phase detector 28.

When both the discriminator and frequency selection paths are arranged to meet the above-noted constraints and low noise circuit stages are employed throughout, it can be shown that the system tuning characteristics are substantially identical to a conventionally arranged phase-locked loop below the frequency $\omega_3/G_0$ and that the phase noise produced is substantially less than the phase noise of a phase-locked loop employing equivalent components and exhibiting an identical bandwidth of $K_\phi K_v/(NG_0)$ (i.e., $\omega_3/G_0$). In this regard, phase noise is: (a) improved by a factor substantially equal to $G_0$ for all frequencies that are offset from the frequency of VCO 16 by less than $\omega_0$; (2) improved by a factor of less than $G_0$ for frequencies greater than $\omega_0$ with the noise performance being identical to a conventionally-arranged system at $\omega_0 G_0$; and, (3) substantially identical to that of a conventional phase-locked loop system for frequencies greater than $\omega_0 G_0$.

Figures 2, 4:
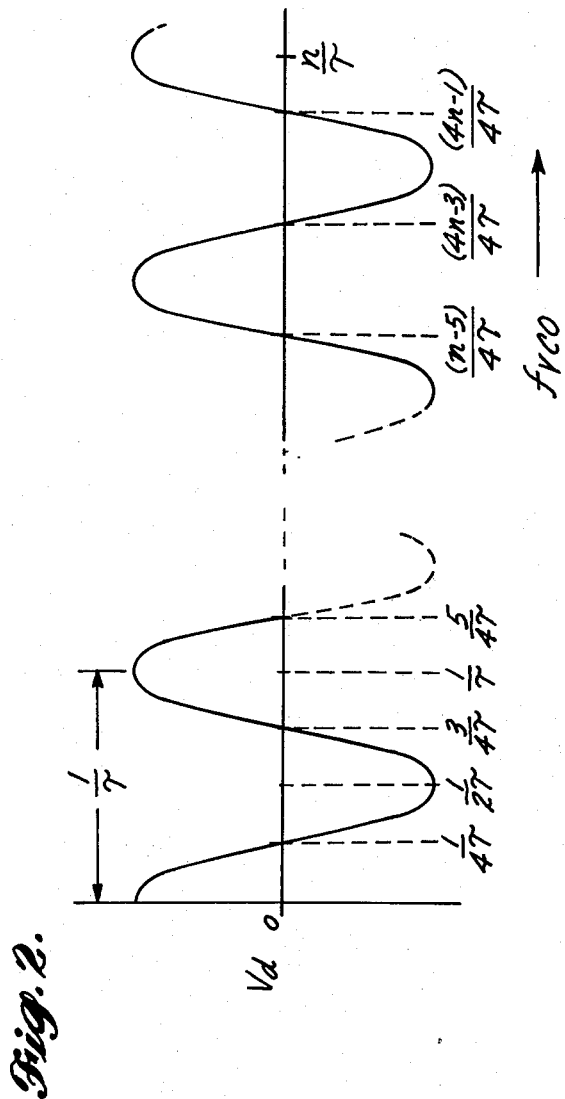
FIG. 2 graphically illustrates electrical characteristics of the discriminator feedback path that are useful in understanding the invention.
FIG. 4 graphically depicts the frequency range of one particular realization of the embodiment depicted in FIG. 1 in a manner which illustrates division of the bandwidth into relatively narrow, contiguous subbands.
Figure 3:
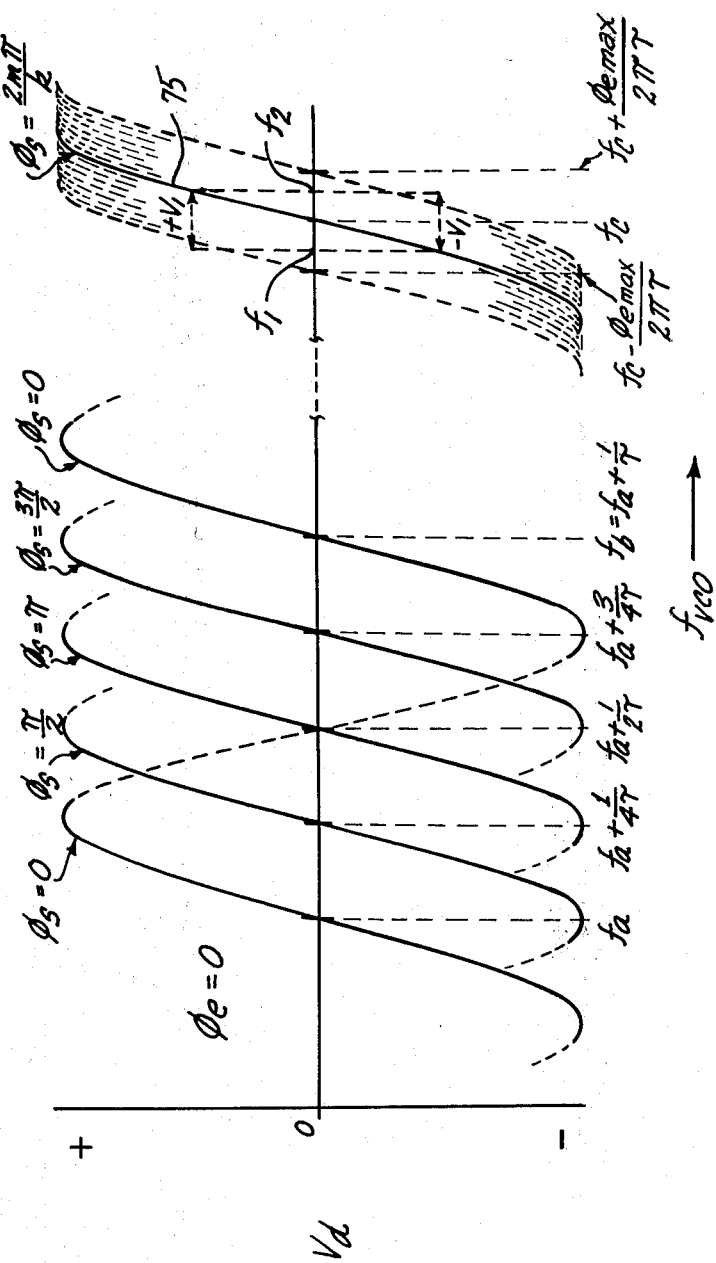
FIG. 3 depicts electrical characteristics of the arrangement of FIG. 1 and system response as the stepped phase shifter and the variable phase shifter are operated in accordance with the invention.

The tuning properties and basic modulation characteristics of embodiment depicted in FIG. 1 can be understood with reference to FIGS. 2 and 3, which depict signal diagrams that define the system discriminator characteristic, i.e., the signal $V_d$ that is supplied by discriminator 18 of the noise-reducing feedback path as a function of the frequency of VCO 16. In this regard, FIG. 2 illustrates the amplitude of the signal $V_d$ as a function of the frequency of VCO 16 when the noise-reducing feedback path is open-circuited to prevent feedback from reaching VCO 16 (e.g., the output of phase detector 38 is disconnected from gain unit 20) and the phase shift provided by stepped phase shifter 40 and variable phase shifter 44 is maintained at zero radians. As is apparent from the previously-mentioned expression $V_d = \cos(\omega\tau + \phi_e - \phi_s)$, the output voltage-input frequency characteristic of discriminator 18 when $\phi_s = \phi_e = 0$ corresponds to the cosine function illustrated in FIG. 2, and referred to hereinafter as the "zero-phase characteristic" of the noise-reducing feedback path.

As will be apparent to those skilled in the art, the zero-phase characteristic of FIG. 2 corresponds to the transfer characteristic of a conventional frequency discriminator that is commonly used to stabilize or lock an oscillator to a desired single frequency that corresponds to a selected zero crossover within a negative-going or positive-going portion of the depicted transfer characteristic. More specifically, if the frequency selection feedback path is open-circuited and $\phi_s = \phi_e = 0$, the arrangement of FIG. 1 would operate as a discriminator signal source that would be stable only when the VCO was tuned to a frequency that corresponds to a zero crossover within a positive-going portion of the discriminator characteristic $((4n-1)/(4\tau)$, where n is a positive real integer) or a zero crossover within a negative-going portion of the discriminator characteristic (i.e., $(4n-3)/(4\tau)$). Thus, for example, if the circuit arrangement of FIG. 1 is initially operating at a signal frequency corresponding to $(4n-1)/(4\tau)$ in FIG. 2 with both $\phi_e$ and $\phi_s$ being constrained equal to zero circuit operation corresponds to that of a prior art discriminator-stabilized oscillator arrangement wherein an increase in the frequency of the signal supplied by VCO 16 causes discriminator 18 to supply a positive output signal and a decrease in the VCO frequency causes discriminator 18 to supply a negative output signal. By properly connecting such a feedback signal to the frequency control terminal of the VCO, e.g., by arranging gain unit 20 to provide inverting operation, negative feedback is provided that automatically returns the VCO to the selected frequency $(4n-1)/(4\tau)$.

As previously mentioned, stepped phase shifter 40, variable phase shifter 44 and the frequency selection feedback path cause the actual operation of the phase-locked loop arrangement of FIG. 1 to differ from such prior art discriminator stabilized signal sources in that stepped phase shifter 40 and variable phase shifter 44 are operated so as to cause a zero crossover of the discriminator characteristic to occur at any frequency that is within the bandwidth of the phase-locked loop, i.e., $V_d = 0$ for all frequencies $f = Nf_{ref}$. More specifically, it can be shown that the zero crossings that are associated with positive-going portions of the output signal versus frequency transfer characteristic of discriminator 18 are given by the expression $$f = \frac{4n - 1}{4\tau} - \frac{\phi_e}{2\pi\tau} + \frac{\phi_s}{2\pi\tau}$$

and that zero crossings associated with negative-going portions of the discriminator transfer characteristic are "located" at frequencies given by the expression $$f = \frac{4n - 3}{4\tau} - \frac{\phi_e}{2\pi\tau} + \frac{\phi_s}{2\pi\tau}$$

Thus, considering an arrangement that is configured to utilize positive-going portions of the discriminator characteristic, it can thus be recognized that $$f = \frac{4n - 1}{4\tau} - \frac{\phi_e}{2\pi\tau} + \frac{m}{k\tau} \qquad (2)$$

where stepped phase shifter 40 of FIG. 1 provides a phase shift $\phi_s = 2\pi m/k$ radians, with k being a preselected positive integer that defines the phase shift increment ("step-size") of stepped phase shifter 40 and m being a preselected nonnegative integer ranging between zero and at least $(k-1)$.

With stepped phase shifter 40 configured in this manner, the basic operation of the embodiment of the invention depicted in FIG. 1 can be understood with reference to FIG. 3, which graphically depicts the discriminator output signal versus frequency characteristic of a realization in which $k = 4$ and $m = 0, 1, 2, 3$ (i.e., an embodiment wherein stepped phase shifter 40 of discriminator 18 exhibits a phase shift increment of $\pi/2$ radians (90°)). As is illustrated in FIG. 3, a crossover of discriminator 18 which occurs at a frequency of $f_a = (4n - 1)/(4\tau)$ when $\phi_s = \phi_e = 0$, is, in effect: (a) moved to $f_a + 1/(4\tau)$ when a phase shift of $\phi_s = \pi/2$ is provided by stepped phase shifter 40 (i.e., $m = 1$); (b) moved to $f_a + 1/(2\tau)$ when $\phi_s = \pi$ (i.e., $m = 2$); and (c) moved to $f_a + 3/(4\tau)$ when $\phi_s = 3\pi/2$. Since, as previously stated, the frequency interval between zero crossings of the discriminator zero-phase characteristic is $1/\tau$, it can be recognized that the frequency interval or band defined between two crossovers within positive-going portions of the discriminator zero-phase characteristic (or negative-going portions), is effectively subdivided into k contiguous subbands through operation of stepped phase shifter 40. For example, in FIG. 3, the frequency interval between $f_a$ and $f_b$ is divided into four subbands, each defining $1/(4\tau)$ hertz of the system bandwidth. The manner in which the entire system bandwidth is subdivided can be understood with reference to FIG. 4, which demonstrates that when the crossover at $f_a = (4n_a - 1)/(4\tau)$ of the system zero-phase characteristic is shifted to $f_a + 1/(4\tau)$ (by setting $m = 1$) crossovers within the zero-phase characteristic that occur at subsequently higher frequencies $f_b = f_a + 1/\tau$, $f_a + 2/\tau, \ldots, f_a + (r-1)/\tau$ are each caused to shift to a frequency that is $1/(4\tau)$ higher than the associated crossover of the zero-phase characteristic, where r is a positive integer that defines the uppermost frequency of interest. Considering the behavior of the system for each value of m (i.e., operation at the various settings of stepped phase shifter 40), it can thus be recognized that "r" crossovers of the zero-phase characteristic are utilized to cover a bandwidth of approximately $r/\tau$ hertz with the stepped phase shifter settings $m = 0, 1, 2, \ldots, (k-1)$ causing the r crossovers to, in effect, move upwardly in frequency by $m/k\tau$ to thereby effectively provide rk discriminator transfer curves that are equally spaced apart from one another by $1/k\tau$ hertz. For example, in a realization of the above discussed embodiment of FIG. 1 wherein $k = 4$ that is to operate between approximately 250 and 520 megahertz, a time delay $\tau = 250$ nanoseconds subdivides the frequency band into 270 subbands that are each 1 megahertz wide and utilizes crossovers of the zero-phase characteristic corresponding to $n = 63, 64, \ldots, 131$.

As is indicated both by Equation 1 and FIGS. 3 and 4, variable phase shifter 44 must provide a phase shift over a range extending at least between $-\pi/k$ radians and $+\pi/k$ radians if discriminator 18 of the arrangement depicted in FIG. 1 is to provide a zero output signal at any selected frequency (i.e., in order to cause a zero crossover of the discriminator characteristic to occur at any frequency that lies within each of the subbands). In terms of the example depicted in FIG. 3 wherein the phase shift increment of stepped phase shifter 40 is equal to $\pi/2$, this means that variable phase shifter 44 must provide a phase shift ($\phi_e = K_s V_p$) over a range extending at least between $-\pi/4$ and $+\pi/4$ in order to, for example, cause the zero crossover at $f_c$ in FIG. 3 to occur at a selected frequency between $f_c - 1/(8\tau)$ and $f_c + 1/(8\tau)$. Further, as is disclosed in the previously-referenced patent application of Meyer, phase shifter control 46 must be configured to provide a phase shift control signal $V_p$ of a polarity that activates variable phase shifter 44 so as to automatically produce a discriminator signal $V_d = 0$ at any selected frequency. For example and with respect to the arrangement of FIG. 1, a positive phase shift, $\phi_e$, causes each zero crossing of the discriminator characteristic to, in effect, shift upwardly in frequency whereas negative $\phi_e$ causes each zero crossing to occur at a corresponding lower frequency. This means that the transfer relationship $\phi_e/V_d$ must be positive, which requires that the transfer function $V_p/V_d$ of phase shifter control 46 and the transfer function of variable phase shifter 44, $\phi_e/V_p$ exhibit the same sign. Thus, if the phase shifter control unit 46 of FIG. 1 is a conventionally arranged operational amplifier integrator circuit having a negative transfer characteristic, the gain constant of variable phase shifter 44 (i.e., $K_s$) must also be negative.

With discriminator 18 arranged in the above-described manner, the system can be tuned to any frequency, $Nf_{ref}$ by selecting a value of m which produces a stepped phase shift $\phi_s$ that causes a zero crossover of the discriminator characteristic to occur at a frequency that is within $\pm\pi/k$ of the selected frequency. This results in a phase detector output signal $V_d$ that, in turn, drives variable phase shifter 44 (via phase shifter control unit 46) in a manner which inserts additional phase shift $\phi_e$ that reduces the magnitude of the discriminator output signal $V_d$ until $V_d = 0$. Thus, as the divisor N of frequency divider 26 in the frequency selection feedback loop is varied, e.g., by programming the system with a digitally-encoded signal VCO 16 is caused to operate at a frequency substantially equal to $Nf_{ref}$ and the noise-reducing discriminator loop causes a zero crossing of the discriminator characteristic to occur at the selected frequency.

Turning now to modulation of the low phase noise phase-locked loop of FIG. 1, the depicted modulation compensator 12 includes two conventional multiplying-type digital-to-analog converter units (DAC's) 64 and 66 having the analog input terminals thereof commonly connected for receiving a modulation signal that is applied to a terminal 68. As shall be described in more detail hereinafter, the digitally-encoded input signal to DAC 64 and DAC 66 is supplied by controller 14 and provides compensation for various factors that would otherwise cause FM inaccuracy. To provide modulation at rates lower than the phase-locked loop bandwidth ($\omega_3/G_0$), the signal provided by DAC 66 is coupled to the frequency control terminal of a voltage-controlled reference oscillator 68 having its output terminal connected to the reference frequency terminal 35 of the phase-locked loop arrangement. In the practice of the invention, reference oscillator 68 is preferably a voltage-controlled crystal oscillator and the frequency deviation $\Delta f$ of VCO 16 when the signal provided by reference oscillator 68 is injected into the input port of phase detector 28 is substantially equal to $D_1 K_x N$, where $D_1$ is the gain or "weighting factor" effected by DAC 66 and the modulation coefficient of reference oscillator 68 is $K_x$. Thus, attaining a constant system modulation characteristic for modulating frequencies that are within the bandwidth of the phase-locked loop does not require that VCO 16 exhibit a constant modulation sensitivity. In particular, if $K_x$ is invariant over the modulated range, setting $D_1$ equal to $1/N$ results in a flat modulation characteristic (relatively invariant deviation ratio) for all modulating frequencies below the crossover frequency of the phase-locked loop ($\omega_3/G_0$).

To modulate the system at rates greater than the phase-locked loop bandwidth ($\omega_3/G_0$), the signal supplied by DAC 64 is coupled to one input terminal of operational amplifier 54 of gain unit 20. Thus, a modulation component proportional to $D_2 \Delta V$, where $D_2$ is the gain or weighting factor of DAC 64, is injected into the noise-reducing feedback path so that the discriminator characteristic is utilized to effect modulation at frequencies outside the loop bandwidth ($\omega_3/G_0$). More specifically and with particular reference to FIG. 3, when the system operates at a carrier frequency $f_c$ the discriminator characteristic denoted by the numeral 75 defines system operation relative to modulation components outside the loop bandwidth in that all signal variations coupled to the input terminal of operational amplifier 54 in FIG. 1 cause a corresponding signal change to be coupled to the VCO frequency control terminal via summing unit 24. In this regard, as is indicated in FIG. 3, a periodic, symmetric modulation component (e.g., a sinusoid) having a maximum amplitude of $V_1$ would cause the VCO 16 to vary between a lowermost frequency $f_1$ and an uppermost frequency $f_2$. As is true with all modulation transfer characteristic curves, the harmonic distortion encountered in the modulated signal depends on the linearity of the transfer characteristic. Additionally, it can be recognized that the deviation ratio is determined by the slope of the modulation characteristic and, if a constant deviation ratio is to be maintained over the full range of carrier frequencies supplied by the system, a constant slope must be maintained over the same range of frequencies.

In a practical embodiment of the arrangement depicted in FIG. 1, each of the indicated circuits or components within discriminator 18 exhibits phase and amplitude characteristics that vary with frequency. Thus, the positive-going (or, alternatively negative-going) portions of the discriminator input frequency to output voltage characteristic do not exhibit identical slope. Moreover, neither the amplitude or delay characteristics of actual realizations of the depicted discriminator 18 are continuous relative to frequency because of the above-discussed operation of the stepped phase shifter 40 in dividing the system bandwidth into subbands which, in effect, position zero crossovers of the discriminator characteristic curve so that a modulation slope is provided at any selected frequency.

In accordance with this invention, the modulation signal supplied to the noise-reducing discriminator feedback path via gain unit 20 is adjusted on the basis of the subband associated with each selected frequency to eliminate major variations in modulation slope that would otherwise cause changes in the system deviation ratio of an intolerable level. In particular, controller 14 of FIG. 1 includes means for determining the subband associated with each selected frequency and, based on such information, supplies a digitally-encoded error correction signal to DAC 64 to adjust the modulation coupled to gain unit 20 in a manner which compensates for changes in the slope of the modulation transfer characteristic associated with a predetermined frequency within that particular subband (e.g., the center frequency of the subband). In addition, controller 14 supplies a digitally-encoded signal representative of the value of N associated with the selected frequency to DAC 66 to provide the previously-mentioned equalization of the modulation component which determines system modulation at rates less than $\omega_3/G_0$. Further, as is indicated in FIG. 1, the digitally-encoded signal representative of N is supplied to frequency divider 26 to cause phase-lock at the selected carrier frequency $Nf_{ref}$ and controller 14 also provides a digitally-encoded signal representative of m to stepped phase shifter 40 to cause insertion of the amount of phase shift $\phi_s = 2\pi m/k$ that is required in order to, in effect, align a zero crossover of the discriminator characteristic with the selected carrier frequency in the manner discussed relative to FIGS. 2 and 3. One convenient manner of determining the subband associated with a selected frequency and, in turn, supplying the necessary correction factor and value of stepped phase shifter (m) is to consider the subbands as an ordered set of r elements that correspond to the ordered set of nonnegative integers 0, 1, 2, 3, ..., r and extend between the lowest and highest selectable frequencies. Thus, the subband, B, that includes a given carrier frequency $f_x$ is given by the expression $B = (f_x - f_a)/\Delta f$, where $f_a$ is the lowermost system frequency and $\Delta f$ denotes the bandwidth of the subband (i.e., $\Delta f = 1/(k\tau)$). Accordingly, the error correction signals or factors associated with subbands can, for example, be stored as a corresponding ordered array in a memory device and accessed in accordance with the above defined value of B. Moreover, it can be shown that the proper value of m for each subband B is given by the noninteger portion (i.e., the remainder) of the ratio $(B + m_o)/k$, where $m_o$ is the value of m associated with the lowest subband (i.e., $B=0$). Thus, a value of m need not be stored for each of the r subbands if the controller computes the noninteger portion of the $(B+m_o)/k$ and utilizes that number in digitally-encoded format as m.

Those skilled in the art will recognize that the computational and signal provision characteristics discussed relative to controller 14 can be implemented in various manners. As is indicated in FIG. 1, one advantageous arrangement utilizes logic circuitry that is commonly identified as a microprocessor and comprises a relatively small number of interconnected commercially-available silicon integrated circuits. As is known in the art, such a microprocessor (depicted in block diagram form in FIG. 1) can be programmed with operating instructions and nonvolatile data by storing such information in a read-only memory such as the erasable programmable read-only memory (EPROM) 70 of FIG. 1. During operation, a central processing unit (CPU) 72 accesses the required system input signals (i.e., a signal representing the desired carrier frequency) via a conventional input/output unit (I/O) 74 in accordance with the instructions stored in EPROM 70 and, utilizing storage registers within a random access memory unit (RAM) 76 as a "scratch pad memory", performs the necessary arithmetic and logic operations (e.g., determines the appropriate value of N; the subband, B, associated with the selected frequency; and, based on the subband of interest the necessary value of m). Properly encoded digital signals are then supplied to the system by I/O unit 74 to thereby cause the system to operate in the above-described manner.

Although those skilled in the art will recognize that various logic designs are possible to effect the functions performed by controller 14, it should be noted that the storage registers which contain the error correction values that are used to compensate the system for slope variations in the modulation characteristics which occur from one subband to another must be programmed when a particular piece of equipment utilizing the invention is constructed and should be capable of reprogramming to accommodate replacement of components within the discriminator 18. In particular, because of component-to-component variations in the amplitude and phase characteristics of each of the previously-described portions of discriminator 18, the error correction factors utilized in accordance with the invention should be established for each system that is constructed in accordance with the invention and such values may not provide sufficient compensation if one or more components within discriminator 18 must be replaced. Thus, a device such as an EPROM is generally utilized.

Various procedures can be utilized for determining appropriate error correction factors during initial construction or calibration and repair of an embodiment of the invention. For example, in an embodiment of the invention wherein $\omega_3/G_0$ is equal to approximately 1 kilohertz and the system provides carrier frequencies ranging between 250 and 520 megahertz with each subband spanning approximately 1 megahertz, the method utilized comprises the steps of: (1) supplying a frequency selection signal to the controller 14 which tunes the system to the center of each subband; (2) supplying a modulation signal having a frequency that is substantially higher than the system bandwidth (e.g., 10 kilohertz in the embodiment under consideration) to the system modulation terminal 69, with the amplitude of the signal being established at a value that is intended to provide a desired frequency deviation (e.g., 100 kilohertz); and (3) determining the setting of DAC 64 necessary to provide the desired frequency deviation (e.g., 100 kilohertz) by adjusting the digitally-encoded signal supplied to DAC 64. Storage registers within EPROM 70 which correspond to each subband are then programmed with values which provide the appropriate error correction signal (i.e., the appropriate digitally-encoded signals for DAC 64).

Providing compensation on a subband-to-subband basis in the above-described manner and judiciously designing the noise-reducing discriminator path to minimize impedance mismatch may provide satisfactory levels of modulation distortion and acceptable variations in the system deviation ratio over the desired range of carrier frequencies. However, in the more demanding situations, compensation that equalizes modulation characteristics at a frequency within each subband may not be sufficient and additional steps may be necessary in order to maintain the system discriminator characteristic of relatively constant at each frequency within that subband. Further, as is noted in the referenced patent application of Meyer, the phase-locked loop filter (30 in FIG. 1) must exhibit a phase shift less than $\pi/2$ at $\omega_3$ in order for the basic low phase noise phase-locked loop to be unconditionally stable. In many situations such a limitation presents somewhat of a problem in that optimum noise performance is achieved when the transfer function of the loop filter exhibits a pole at or near $2\omega_3/G_0$. In accordance with this invention, each of these potential problems and limitations are eliminated or greatly reduced by augmenting a system of the type described relative to FIG. 1 with various additional circuitry such as that depicted in FIG. 5.

Figure 5:
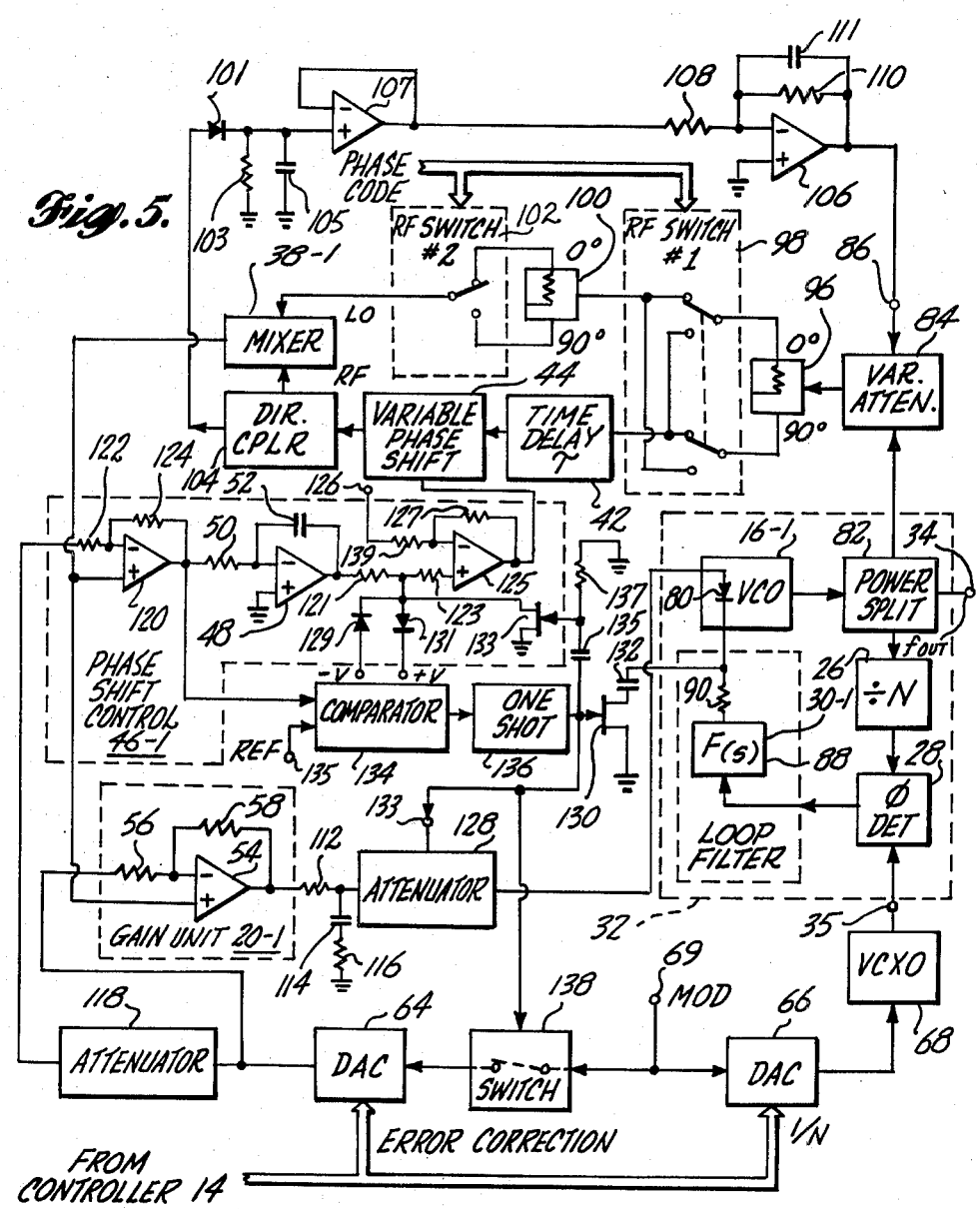
FIG. 5 illustrates a more detailed embodiment of the invention that includes provision for improved modulation within each of the frequency subbands and additional circuitry for controlling operation of the system whenever a new carrier frequency is selected that lies within a different subband.

Prior to examining the various additional circuit components within the arrangement of FIG. 5 that maintain low FM distortion and a relatively constant deviation ratio within each of the system subbands, it should be noted that the depicted arrangement also includes various modifications and variations relative to the embodiment of FIG. 1. For example, the basic programmable divide-by-N phase-locked loop that is included within dashed outline 32 in FIG. 5 corresponds to the phase-locked loop contained within dashed outline 32 of FIG. 1, with additional details being shown in FIG. 5 to indicate the presently preferred type of components and to provide clarity of description relative to the hereinafter-discussed additional features of FIG. 5 that relate to maintaining a linear, constant slope discriminator characteristic over the relatively narrow subbands of frequency. More specifically, in the presently preferred embodiments the VCO incorporates or includes the summing network 24 of the arrangement of FIG. 1 so as to minimize generation of noise within circuitry that carries the noise-reducing feedback signal. As is known to those skilled in the art, various VCO's of this general type are available, including various VCO's configured in the manner of VCO 16-1 of FIG. 5 wherein electrical connection can be made to each terminal of a varactor diode 80 which controls the frequency of the VCO. Regardless of the type of VCO employed, when the invention is embodied for relatively high frequency operation, the signal provided by the VCO 16-1 is coupled to a conventional power divider 82 with the first output port of the power divider 82 supplying a signal to the frequency divider 26 of the signal selection path, the second output port of the splitter 82 coupling a signal to a variable attenuator 84 of the noise-reducing discriminator feedback path and the third output port supplying the system output signal. As shall be described in more detail hereinafter, variable attenuator 84 of the noise-reducing feedback path controls the signal level so as to prevent, or at least partially eliminate, amplitude variations in the signal coupled to the discriminator phase detector.

The final variation in the frequency selection feedback path relative to the arrangement of FIG. 1 is that loop filter 30-1 of FIG. 5 includes a first filter network 88 connected in cascade with a simple lead-lag filter comprising a resistor 90, which is serially connected between first filter network 88 and one terminal of varactor 80, and a capacitor 132 that is connected between circuit common potential and resistor 90 via the source-to-drain path of a field-effect transistor 130. As shall be described in more detail hereinafter, field-effect transistor 130 functions as a variable resistor to establish a low frequency pole in the gain function of the phase-lock loop whenever system turn-on or tuning sequences cause the magnitude of the noise-reducing feedback signal to fall below a predetermined level. This counteracts the reduction in loop gain to maintain phase-lock loop bandwidth substantially constant for all system conditions.

FIG. 5 also illustrates one arrangement for realizing stepped phase shifter 40 of FIG. 1 in a manner which is easily implemented and is compatible with system noise requirements. In the depicted arrangement, the signal supplied by the VCO 16-1 is coupled to the input port of a first quadrature 3 db coupler or hybrid network 96 having the output ports that supply an in-phase signal and a signal delayed by $\pi/2$, respectively, connected to the two input terminals of a first RF switch 98. As is indicated in FIG. 5, first RF switch is responsive to a digitally-encoded signal (identified as the phase code signal in FIG. 5) and functionally corresponds to a double-pole double-throw switch that is interconnected so that the signal that does not exhibit phase shift is supplied to the input port of a second quadrature 3 db coupler 100 and the signal exhibiting a phase shift of $\pi/2$ is coupled to the input port of the time delay unit 42 when the switch is deenergized (e.g., when the phase code signal is equal to a logical zero). On the other hand, when RF switch 98 is energized by, for example, applying a logical one signal to the switch control terminal, the quadrature signal is coupled to the input port of quadrature 3 db coupler 100 and the signal that does not exhibit phase shift is coupled to the input port of time delay unit 42. Since RF switch 98 selectively couples a phase shift of $\pi/2$ radians into one of the two input paths of the discriminator phase detector 38-1 while coupling a phase shift of 0 radians into the other input path, it can be noted that operation of RF switch 98 causes the phase difference between the signals coupled to the input ports of the phase detector (mixer 38-1, in FIG. 5) to change by $\pi$ radians (180°). More specifically, since the phase shift of the stepped phase shift arrangement of FIG. 5 is defined as the amount of phase shift inserted in the phase detector input path that includes time delay unit 42 and variable phase shifter 44 subtracted from the amount of phase shift inserted in the other input path of phase detector 38-1, when $\phi_e=0$, the phase shift is $-\pi/4$ radians with RF switch 98 deenergized and $\pi/4$ radians with RF switch 98 energized.

To complete the stepped phase shifter arrangement of FIG. 5, the output ports of the second quadrature 3 db coupler 100 are connected to a second RF switch 102, which is activated by additional bits within the phase code signal and corresponds to a single-pole double-throw switch that selectively couples the signal supplied by the quadrature and in-phase output ports of the quadrature 3 db coupler 100 to the local oscillator (LO) input port of a doubly-balanced mixer 38-1 that serves as the phase detector of the noise-reducing feedback path. In this regard, a doubly-balanced mixer of the Schottky barrier diode type having a limiting LO input port and a linear RF signal port is preferably employed because such a mixer exhibits a relatively low noise figure and thus is advantageous in obtaining optimum noise performance.

Regardless of the type of phase detector employed, it can be recognized that RF switch 102 selectively adds an additional $\pi/2$ radians of phase shift in the phase detector input path that does not include time delay unit 42 and variable phase shifter 44. Combining this phase shifting capability with that provided by RF switch 98, it can be seen that the stepped phase shift arrangement utilized in FIG. 5 provides phase shift in accordance with Table 1, in which: the phase code signal is considered to be a two-bit binary word with the first bit controlling the operational state of RF switch 98 and the second bit controlling the operational state of RF switch 102.

TABLE I

| PHASE CODE | PHASE SHIFT |
|---|---|
| 00 | $-\pi/2$ |
| 01 | 0 |
| 10 | $\pi/2$ |
| 11 | $\pi$ |

Thus, considering the decimal equivalent of the phase code to be equal to m in the arrangement of FIG. 1, it can be recognized that the crossovers associated with positive going portions of the discriminator characteristic of the arrangement of FIG. 5 occurs at frequencies $$f = \frac{(4n-1)}{4\tau} - \frac{\phi_e}{2\pi\tau} + \tag{3}$$

$$\frac{(m-1)}{4\tau} = \frac{(2n-1)}{2\tau} - \frac{\phi_e}{2\pi\tau} + \frac{m}{4\tau}$$

comparing this expression to that for the system of FIG. 1 it can be seen that the system bandwidth is subdivided in the manner described relative to FIG. 3, the only difference being that each crossover frequency is, in effect, shifted downward in frequency by $1/(4\tau)$ because the stepped phase shifter employed in FIG. 5 supplies a phase shift of $2\pi(m-1)/k$ radians rather than the $2\pi m/k$ radians supplied by the embodiment described relative to FIG. 1. This aspect of the arrangement of FIG. 5 will be discussed in the operational description that is presented following a discussion of the remaining structural features of the depicted arrangement.

The discriminator portion of the noise-reducing feedback path utilized in the arrangement of FIG. 5 also includes a variable phase shifter 44, which couples the signal supplied by time delay unit 42 to the RF input port of mixer 38-1 via a directional coupler 104, and a phase shift controller 46-1 for activating the variable phase shifter 44 in the manner described relative to the embodiment of FIG. 1. Variable phase shifter 44 of the arrangement depicted in both FIGS. 1 and 5 can either be a broadband phase shifter that is capable of producing the necessary phase shift $\pm\pi/k(\pm\pi/4$ for the arrangement of FIG. 5) or can be a tunable phase shifter of more limited frequency range that is adjusted so as to, in effect, track the selected frequency $Nf_{ref}$. For example, in one realization of the embodiment of FIG. 5, a three-stage tunable band-pass filter utilizing varactor diodes as the tuning and phase shift control elements is utilized. When a tunable narrow bandwidth phase shifter is employed, the necessary filter tuning signal can be supplied by phase shift control unit 46. For example, in the phase shifter control 46-1 of FIG. 5, the signal supplied by the signal integrator formed with operational amplifier 48 is coupled to the noninverting input terminal of an operational amplifier 125 via series connected resistors 121 and 123. The output terminal of operational amplifier 125 is coupled to the control terminal of variable phase shifter 44 and a feedback resistor 127 is connected between the output and inverting input terminals of amplifier 125. Since the inverting input terminal is connected to a terminal 126 via a resistor 139, it can be recognized that a dc tuning signal applied to terminal 126 in effect cause operational amplifier 125 to supply a bias signal to the phase shift control terminal of variable phase shifter 44 so as to establish the center frequency of the tunable filter. In such an arrangement, the filter is tuned so that a phase shift $\phi_e = 0$ is supplied at the center frequency of the subband in which the system is operating. Thus, the filter tuning signal supplied to terminal 126 must vary in accordance with the subband associated with the selected signal frequency $Nf_{ref}$. For example, appropriate values for the phase shifter tuning signal can be determined experimentally; stored in EPROM 70 of the controller 14 (FIG. 1) at storage addresses associated with the corresponding subband; and, accessed and converted to an appropriate analog signal, which is applied to the terminal 126 when the system is tuned to each desired frequency. Conversion from the stored digitally-encoded signal to an analog signal of proper magnitude can, for example, be accomplished through use of a conventional multiplying-type digital-to-analog converter, such as DAC's 64 and 66 of FIGS. 1 and 5.

In an embodiment which employs a tunable filter or other relatively narrowband device as variable phase shifter 44, it may be desirable to include circuitry for preventing transient signals from reaching the phase shifter control terminal at an amplitude that could cause the phase shifter to be tuned so that the selected system frequency ($Nf_{ref}$) is outside the phase shifter passband. For example, in the embodiment of FIG. 5, oppositely poled diodes 129 and 131 are connected from the junction of resistors 121 and 123 to terminals that are supplied with potentials $+V$ and $-V$. As can be seen in FIG. 5, this limits the signal that is supplied to the noninverting input terminal of operational amplifier 124, and hence limits the signal supplied to the phase shift control terminal of variable phase shifter 44.

The circuit configuration utilized in the noise-reducing feedback path of FIG. 5 for attaining the previously-discussed circuit zero at or near $\omega = \pi/\tau$ also differs from that utilized in the arrangement of FIG. 1. In particular, in gain unit 20-1 of FIG. 5, circuit gain is determined by input resistor 56 and feedback resistor 58 that are connected to the inverting input terminal of gain unit 20-1 in the conventional manner for effecting gain with signal inversion relative to the modulation component that is coupled to resistor 56. The noise-reducing feedback signal is coupled to the noninverting input terminal of operational amplifier 54 and the desired zero in the circuit transfer function is achieved by a resistor 112, capacitor 114, and resistor 116 that are serially connected between the output terminal of the operational amplifier and ground potential, with the junction between resistor 112 and capacitor 114 being coupled to varactor 80 of VCO 16-1 via an adjustable attenuator 128. As shall be described hereinafter, the adjustable attenuator 128 forms a portion of the previously-mentioned circuitry for ensuring that the system is unconditionally stable when, for example, VCO 16-1 is tuned to a frequency that lies outside the subband associated with the present frequency of operation.

Turning now to the features of the arrangement of FIG. 5 which are directed to maintaining a constant discriminator characteristic throughout each of the subbands, variations in the signal level coupled to the input ports (LO and RF ports) of the mixer 38-1, which would otherwise cause frequency dependent variations in the system discriminator characteristic, are greatly reduced by variable attenuator 84 of the depicted arrangement. More specifically, in the embodiment of FIG. 5, an output terminal of directional coupler 104 is coupled to the input terminal of a voltage follower stage 107 via a diode 101, which in conjunction with a resistor 103 and capacitor 105 that are connected in parallel with one another between circuit common and the cathode of diode 101, function as a detector circuit. The output terminal of voltage follower 107 is connected to the inverting input terminal of an operational amplifier 106 via a resistor 108 and the output terminal of operational amplifier 106 is connected to the control terminal 86 of a variable attenuator 84. A resistor 110 and a capacitor 111 are connected between the inverting input terminal and output terminal of amplifier 106 to provide feedback. Variable attenuator 84, which is a conventional attenuator circuit such as those utilizing high frequency field-effect transistors or other devices such as P-i-n diodes, is arranged so that the amount of attenuation inserted between the output terminal of power divider 82 and the input terminal of first quadrature 3 db coupler 96 is directly proportional to the magnitude of the signal supplied to operational amplifier 106 by voltage follower 107 and detection diode 101. Since the signal supplied to detection diodes 101 by directional coupler 104 is proportional to the signal being supplied to the RF input port of the mixer 38-1, it can be recognized that the circuit constitutes what is commonly called a leveling loop and, thus, variable attenuator 84 operates in a manner which tends to maintain a constant signal level at the RF input port of mixer 38-1. In effect, this mode of operation transfers signal level variations that would normally occur at the RF input port of the mixer 38-1 to the LO input port. Since the LO input port is a limiting port (whereas the RF input port is a linear input port), this results in a substantial reduction in the output signal level variations of mixer 38-1 (typically reducing signal level variation by a factor of approximately 5 or more) relative to signal variations that would occur in the absence of the above-described operation of variable attenuator 84.

In addition, the arrangement of FIG. 5 is also configured to substantially reduce modulation-induced variations in the control signal coupled to variable phase shifter 44 by phase shift controller 46 that could cause corresponding variations in the signals supplied by mixer 38-1 and hence result in harmonic distortion of the FM signal and variation in the system deviation ratio as a function of the selected frequency. Further, if not eliminated or adequately reduced, modulation-induced variations in the variable phase shifter control signal could cause inadvertent and false operation of the hereinafter-described portion of FIG. 5 that ensures unconditional stability of the depicted system during all modes of operation, including tuning sequences.

In the arrangement of FIG. 5, modulation-induced variations in the phase shifter control signal are substantially reduced by "bucking" (or feedforward) arrangement wherein the undesired modulation-induced signal component is substantially reduced by summation with a signal component of substantially the same amplitude and a phase difference of $\pi$ radians. More specifically, attenuator 118 supplies a signal representative of the signal that modulates the system at rates greater than $\omega_3/G_0$ to the inverting input terminal of an operational amplifier 120 via a resistor 122. Since the discriminator output signal (provided by mixer 38-1) contains the undesired modulation and is connected to the noninverting input terminal of operational amplifier 120, the signal coupled from operational amplifier 120 to operational amplifier 48 is relatively free of modulation-induced signal components. For example, at least 12 db attenuation of the modulation component is easily attained through operation of operational amplifier 120 and such amount is sufficient to provide satisfactory operation of the embodiment of FIG. 5.

With regard to the portion of FIG. 5 which ensures that the system is unconditionally stable under all operating conditions, it can be recalled that the arrangements disclosed in the previously-referenced patent application of Meyer are somewhat limited in that the filter circuit within the frequency selection path (e.g., loop filter 30 of FIG. 1 and loop filter 30-1 of FIG. 5) must exhibit less than $\pi/2$ radians of phase shift for all offset frequencies less than $\omega_3$ in order to provide adequate phase margin. This constraint arises because the effective loop bandwidth of a system configured in accordance with the invention is $\omega_3/G_0$, where, as previously mentioned, $\omega_3$ is the bandwidth of a phase-locked loop not including the noise-reducing feedback path and $G_0$ is the gain of the noise-reducing feedback path. Thus, when the noise-reducing feedback path is open circuited, system bandwidth increases to that of a phase-locked loop not employing the noise-reducing feedback path. For example, in the arrangement of FIG. 5, the noise-reducing feedback path is at least momentarily open-circuited during a tuning sequence wherein the value of stepped phase shift is altered by activating RF switches 98 and 102 and, since typical embodiments utilize a $G_0$ on the order of 100, the effective loop bandwidth increases substantially. Alternatively, when the system is initially energized or turned-on, the system VCO may operate at a frequency that corresponds to a maxima or minima in the system discriminator characteristic depicted, e.g., the discriminator characteristics depicted in FIG. 3. When this occurs, the discriminator, in effect, is operating with a characteristic curve having zero slope and the bandwidth of the system increases to $\omega_3$. Regardless of the cause for the increase in loop bandwidth, the system is, at best, only conditionally stable under such conditions and unless the loop filter is designed to exhibit less than $\pi/2$ radians of phase shift at $\omega_3$ or other provisions are made, the system may oscillate.

The arrangement of FIG. 5 ensures unconditional system stability without imposing design constraints on the system filter by reducing the gain of the noise-reducing discriminator loop and the gain of the frequency selection path (phase-lock loop) with tracking attenuators so that the effective loop bandwidth is maintained relatively constant under operating conditions that could otherwise result in the above-mentioned potential circuit instability. In the arrangement of FIG. 5, the attenuator for decreasing the gain of the noise-reducing feedback path is a controlled or variable attenuator 128, which is connected between gain unit 20-1 and the frequency control port of VCO 80. A field-effect transistor 130, having the source electrode thereof connected to the circuit common potential and the drain electrode interconnected to the junction between resistor 90 and one frequency control terminal of VCO 16-1 via a capacitor 132, reduces the gain of the frequency selection (phase lock) feedback path. To operate attenuator 128 and the attenuator formed by field-effect transistor 130 in unison with one another, a control terminal 133 of attenuator 128 and the gate electrode of the field-effect transistor 130 are commonly connected for receiving the signal supplied by a one-shot multivibrator 136. In this arrangement, one-shot multivibrator 136 is activated by a signal comparator 134, having a first input terminal connected to the output terminal of operational amplifier 120 and a second input terminal 135 that is connected to terminal 135 for receiving a a reference potential.

Comparator 134 is a conventional circuit arrangement that is activated whenever the magnitude (absolute value) of the signal supplied by the system discriminator (mixer 38-1 in FIG. 5) exceeds a predetermined level established by the reference potential that is applied to terminal 135. In particular, the reference potential is established so that signal comparator 134 activates one-shot multivibrator 136 whenever the signal level supplied by operational amplifier 120 indicates that the noise-reducing feedback path is operating outside the nominally linear region of its characteristic curve, e.g., the signal being supplied to operational amplifier 120 by mixer 38-1 is less than $-V_1$ or greater than $+V_1$ of FIG. 3. When activated, one-shot multivibrator 136 supplies a signal pulse of a time duration sufficient to allow the system to stabilize at a newly selected frequency if the system condition that causes comparator 134 to activate is the initiation of a tuning sequence. Regardless of the type of disturbance which activates comparator 134, one-shot multivibrator 136 causes field-effect transistor 130 to enter a conducting or ON state which connects capacitor 132 to the circuit common potential via the drain-to-source path of field-effect transistor 130. Since field-effect transistor 130 exhibits a relatively low resistance while in the ON state (which is commonly denoted as $R_{ds}(ON)$ and is typically 30 to 50 ohms), this effectively moves the pole of the simple lead-lag filter defined by resistor 90, field-effect transistor 130 and capacitor 132 downward in frequency so as to decrease the gain of the frequency selection (phase lock) feedback path by a desired amount.

As previously mentioned, attenuator 128 is also energized by the signal pulse supplied by one-shot multivibrator 136 and thus is activated at the same time as field effect transistor 130. In this regard, attenuator 128 is arranged to cause signal attenuation that complements and tracks the conductance changes in field-effect transistor 130 during the entire period of the signal supplied by one-shot multivibrator 136, including the signal transition periods in which field-effect transistor 130 and attenuator 128 are energized and deenergized. That is, attenuator 128 and field effect transistor 130 ideally have identical effects on the gain of the noise-reducing feedback path and the frequency selection path (respectively), to thereby maintain a constant overall system gain during the entire time period in which one-shot multivibrator 136 applies a signal.

Those skilled in the art will recognize that various conventional circuit arrangements can be utilized as comparator 134, one-shot multivibrator 136 and attenuator 128. In this respect, attenuator 128 can be realized by a field-effect transistor arranged to form a complementary signal attenuator relative to the attenuator defined by field effect transistor 130. Further, it has been found advantageous to utilize a circuit arrangement for one-shot multivibrator 136 that supplies a signal pulse having a relatively long fall time so as to prevent signal transients and ensure adequate tracking as the system reverts to normal operation.

One-shot multivibrator 136 is also utilized in the embodiment of FIG. 5 to momentarily cause the variable phase shifter to operate with zero phase shift ($\phi_e=0$) each time a tuning sequence or other transient condition causes comparator 134 and one-shot 136 to energize. This prevents the system from entering into an unstable condition wherein the noise-reducing feedback path causes operation with the wrong slope of the discriminator characteristic. For example, the embodiments discussed herein utilize positive-going portions of the discriminator characteristic and, if a transient caused the system to momentarily operate at a frequency within a negative going region of the discriminator characteristic, positive feedback would be supplied through the noise-reducing feedback path and instability would result.

To totally eliminate any possibility that such instability could occur, the signal supplied by one-shot multivibrator 136 is differentiated by a capacitor 135 and resistor 137 that are connected between the output terminal of one-shot 136 and circuit common. The differentiated signal is coupled to the gate electrode of a field-effect transistor 133, or other type of switching device which enters a conducting state in response to the differentiated signal. Since the source electrode of the field-effect transistor 133 is connected to circuit common and the drain electrode is connected to the junction of resistors 121 and 123, it can be recognized that the phase shift command signal which is provided by the discriminator is substantially eliminated during the interval in which field-effect transistor is conducting. Thus, the tuning voltage that is coupled to the control terminal of variable phase shifter 44 is determined by the potential applied to terminal 126 and the tunable filter utilized as phase shifter 44 is momentarily set to provide zero phase shift for a frequency that corresponds to the center of a subband.

In addition, the presently preferred embodiments of the invention also include means for interrupting the signal path that couples modulation into the noise reducing feedback path during tuning procedures and other situations in which the gain of the noise-reducing feedback path and frequency selection feedback path are decreased by field-effect transistor 130 and attenuator 128. In particular, because of various component tolerances and factors such as differing temperature coefficients, the signal attenuator defined by field-effect transistor 130 and capacitor 132 does not cause a gain reduction in the frequency selection path that exactly tracks the gain reduction in the noise-reducing feedback path that is effected by attenuator 133. For example, in one embodiment of the invention, the above-described technique reduces the variation in bandwidth from a ratio of approximately 100 to 1 to a ratio of approximately 3 to 1 by inserting approximately 40 db of attenuation in both feedback paths. Although a significant improvement and adequate for purposes of providing sufficient phase margin without imposing additional design constraints on the phase-lock loop filter network, variations of such magnitude still may have a substantial effect on the system modulation flatness characteristic. In this regard, the previously discussed signal cancellation or "bucking" that is utilized in the arrangement of FIG. 5 to reduce the amount of modulation component reaching phase shift controller 46 may not be effective during such time intervals. Since controlled attenuator networks exhibiting precise complementary gain switching characteristics which would totally eliminate variations in system bandwidth are relatively complex, the arrangement of FIG. 5 utilizes an RF switch 130 in the signal path between terminal 69 and DAC 64 to interrupt the modulation component that is normally injected into the noise-reducing feedback path. As is indicated in FIG. 5, RF switch 130 is a conventional device that functionally corresponds to a normally-closed single-pole switch and is activated by one-shot multivibrator 136. Like signal attenuator 128, RF switch 138 can be implemented by a conventional field-effect transistor circuit arrangement.

A brief summary of the various aspects of the present invention and additional insight as to practical considerations relevant to embodying the invention in commercial quantities can be had with reference to FIG. 6, which is a partial tabulation of various system parameters typical of unit that is constructed substantially in accordance with the arrangement of FIG. 5. The particular unit under discussion being constructed under a design intended to ideally generate carrier frequencies ranging between 250 and 520 megahertz by utilizing a time delay having a design value of 250 nanoseconds and a stepped phase shifter that corresponds to that of FIG. 5 (i.e., $\phi_s=(m-1)\pi/2$, where m denotes the decimal equivalent of the phase code signal supplied to RF switches 98 and 102). Based on these design values it can be recognized that such a design would exhibit a discriminator characteristic (FIG. 2) that includes zero crossovers within positive-going portions (or negative-going portions) which are spaced apart from one another by a frequency interval of exactly 4 megahertz (i.e., $1/\tau=4$ megahertz) (if $\tau$ is exactly 250 nanoseconds) and would utilize subbands throughout the full frequency range, spanning exactly 1 megahertz (i.e., $1/(4\tau)=1$ megahertz). In this regard it can be recognized from Equation 3 and from previous discussions herein that the center frequencies of the subbands in such an ideal realization of the embodiment being considered would correspond to 250 Mhz, 251 Mhz, 252 Mhz, ... 520 Mhz and that a phase shift range of exactly $\pm\pi/4$ radians must be provided by variable phase shifter 44 to permit the system to be tuned to any frequency within each of the subbands (i.e., any frequency between 249.5 megahertz and 520.5 megahertz).

Those skilled in the art are aware that the time delay provided by various delay devices including sections of transmission line (e.g., coaxial cable) and surface acoustic wave devices is not totally invariant over a frequency range that spans an octave or more. In this same regard, because of normal circuit tolerances, the time delay units, variable phase shifters and other types of components utilized in practical realizations of the invention do not exhibit the exact design value. Additionally, factors such as the various temperature coefficients of the different devices cause the associated system parameter values to vary with temperature, time or other environmental factors. In the practice of this invention, these practical considerations and constraints affect the value of the various quantities defined by the previously set forth mathematical relationships to the extent that few units, if any, exhibit ideal system operation. However, the invention accommodates normal variations in component values through the manner in which each particular unit is calibrated at the time of manufacture and during any necessary recalibration procedure. In this respect, one convenient method for accommodating variations in time delay ($\tau$) that occur from one unit to another and the slight variation in the time delay that each particular unit exhibits over the relevant frequency range, involves determining an average value of $\tau$ and defining particular subbands for the system utilizing that time delay unit on the basis of the average value of time delay. For example, in constructing the presently preferred embodiments of the invention, the average value of $\tau$ is emperically determined for each particular unit by measuring system time delay at the lowermost system frequency, the uppermost system frequency and at least one intermediate frequency. Each subband is then considered to span exactly $1/(4\tau_a)$, where $\tau_a$ is the emperically-determined value of time delay for that unit. By way of specific example and with reference to FIG. 6, in the exemplary unit being discussed the subbands each define 1.050 megahertz of the overall bandwidth; a frequency interval which results from an average value of time delay that is approximately equal to 238.1 nanoseconds.

To account for the different temperature coefficients and other design factors, the variable phase shifter utilized should be capable of effecting a phase shift that is greater than the minimum design value of $\pm\pi/k$ (e.g., $\pm\pi/4$, for the particular system being considered). Further, it is advantageous to utilize a lowermost subband (subband #0 in FIG. 6) which lies below the intended system frequency range. For example, in the design of the unit under discussion, subband #0 is arbitrarily defined as the first subband that lies entirely below the minimum design frequency of the system. Moreover, because the time delay of this particular unit is somewhat below the nominal or design value of 250 nanoseconds, less than 270 subbands are required to produce the desired system frequency range. In this regard, the uppermost system subband can be arbitrarily defined to be that subband which exceeds the highest desired system frequency by a predetermined amount. For example, in the design that resulted in the particular unit under discussion, the uppermost system subband is defined as the second subband which lies above the uppermost system design frequency. As can be seen in FIG. 6, the particular time delay associated with the prototype being discussed results in a requirement for 260 subbands rather than the 270 that would be required if $\tau$ was exactly equal to 250 nanoseconds.

With a particular realization of the invention being established in the above-described manner, the previously-discussed procedure can be carried out to determine the necessary value of the correction factor for each subband of the particular embodiment being constructed. In this regard, as previously described, the unit being constructed is tuned to a predetermined frequency within each of the subbands (e.g., the center frequency, wherein the variable phase shifter does not insert phase shift) and the correction factor that is necessary to cause the system to provide a predetermined frequency deviation in response to a signal of fixed amplitude and a frequency that lies outside the effective loop frequency is applied to the modulation input. For example, referring to FIG. 6, it can be seen that the particular unit under discussion requires the modulation signal to be increased by a factor of 1.223 in subband 33 (the frequency subband extending between 282.87 and 283.9199 megahertz) and requires a weighting factor of 0.920 within subband 34. As is further indicated in FIG. 6, these particular correction factors require application of a digitally-encoded signals to DAC 64 that respectively have a decimal equivalent of 584 and 439.

Although the above-mentioned practical considerations mean that the subbands of a particular unit constructed in accordance with the invention differs from those utilized in another realization of the same embodiment and are not exactly predicted by application of Equations 1 through 3, the computational technique for determining the subband associated with a selected frequency and the necessary value of stepped phase shift (phase code) is not altered from that described relative to the embodiment of FIG. 1. In particular, controller 14 computes the subband B associated with a selected frequency according to the mathematical expression $B=(f_x-f_a)/\Delta f$ where $f_a$ is the lowermost system frequency (248.22 megahertz for the prototype that supplied the data presented in FIG. 6) and $\Delta f$ denotes the bandwidth of each subband (1.050 megahertz for the particular unit under consideration) and $f_x$ denotes the selected frequency. Thus, it can be recognized that it is generally advantageous to store the value of $\Delta f$ and $f_a$ within the memory unit of controller 14 for use in computing the system subband.

For example, with the microprocessor arrangement of FIG. 1, these values are stored in EPROM 70 and accessed by the CPU unit 72 each time a carrier frequency is selected. Thus, if the particular unit associated with the information in FIG. 6 is initially tuned to a frequency of 286.7890 megahertz it is operating within subband 36 and a digitally-encoded signal having a decimal equivalent of 514 is supplied to DAC 64. As is also indicated in FIG. 6, the phase code setting for operation in subband 36 is 10, which causes the RF switches 98 and 102 of FIG. 5 to operate so as to provide $(m-1)\pi/4=\pi/4$ radians (90°) of phase shift. If the system is then retuned to, for example, 283.6654 megahertz, calcuation of the appropriate subband in accordance with the above-stated mathematical expression yields 33.7575, indicating that the system is to operate in subband 33, as is indicated in FIG. 6. Applying the previously discussed relationship wherein the decimal equivalent of the necessary phase code (m) for each subband (B) is equal to the remainder of $(B-m_o)/k$, accurately determines a phase code of 3 for subband 33, since the phase code in subband $0(m_o)$ is 10, which corresponds to a decimal value of 2.

Having considered the invention relative to the embodiments of FIGS. 1 and 5, those skilled in the art will recognize that various modifications and variations can be made without exceeding the scope and the spirit of the invention. For example, it is well-known in the art that modulation of a phase-locked loop system over a broad range of carrier frequencies can also be effected by phase modulating the loop phase detector as well as by frequency modulating the reference oscillator that supplies the phase detector the system reference signal. More specifically and in terms of embodiments of FIGS. 1 and 5, the modulation component for effecting modulation at rates inside the loop bandwidth can be coupled into the frequency selection (phase-lock) feedback path at the output port of phase detector 28 if the signal is fed through a conventional integrator circuit. In such an arrangement, compensation for the selected carrier frequency, $Nf_{ref}$, is not effected by adjusting the magnitude of the modulation component, but is accomplished by controlling the gain of phase detector 28 as a function of (1/N). For example, a frequency/phase detector of the type wherein a desired gain can be established by controlling the current through the detector diodes can be employed and a multiplying type digital-to-analog converter (e.g., DAC 66) can be used to establish the proper phase detector current.

The embodiments of the invention in which an exclusive property or privilege is claimed are defined as follows:

1. A modulated phase-locked loop system comprising:

controlled oscillator means having an output terminal and a frequency control terminal, said controlled oscillator means supplying a signal to said output terminal at a frequency determined by the magnitude of a frequency control signal applied to said frequency control terminal;

a first feedback path responsive to the signal supplied by said controlled oscillator means to said output terminal thereof for supplying a feedback signal to said frequency control terminal of said controlled oscillator means, said first feedback path including a frequency discriminator network including phase detector means having an output port and first and second input ports and coupling means for coupling said signal supplied to said output terminal of said controlled oscillator to said first and second input ports of said phase detector means, time delay means exhibiting a time delay of $\tau$, said time delay means being connected to delay said signal coupled to one of said first and second input ports of said phase detector means, variable phase shift means having an input terminal, an output terminal and a phase shift control terminal, said variable phase shift means being connected to shift the phase of the signal coupled to one of said first and second input ports of said phase detector means by $\phi_e$ radians, where $\phi_e$ is greater than a predetermined lower phase shift limit and is less than a predetermined upper phase shift limit, said phase shift $\phi_e$ being determined by a signal applied to said phase shift control terminal, said frequency discriminator further including stepped phase shift means responsive to an applied phase step control signal, said stepped phase shift means being connected for shifting the phase of the signal coupled to one of said first and second input ports of said phase detector means by $2\pi m/k$, where m is an integer determined by said applied phase step control signal and k is a predetermined real positive number; said time delay, said variable phase shifter and said switched phase shifter causing said difference in phase between said signals coupled to said first and second input ports of said phase detector means to be substantially equal to $2\pi f \pm \phi_e \pm \phi_s$, where f denotes the frequency of said signal supplied to said output terminal of said controlled oscillator means; said phase detector means of said frequency discriminator exhibiting a transfer function of a periodic form that causes said frequency discriminator to supply a signal substantially equal to zero when $\phi_e$ and $\phi_s$ are equal to zero and said signal supplied to said output terminal of said controlled oscillator exhibits a frequency of $f_a + n/\tau$, where $f_a$ is a predetermined frequency that is a function of $\tau$ and n is an element of the set of nonnegative integers; said first feedback path further including phase shift control means connected for receiving said signal supplied by said frequency discriminator and connected for supplying said control signal to said phase shift control terminal of said variable phase shift means, said phase shift control means including means for inserting the amount of phase shift $\phi_s$ required to cause said frequency discriminator to supply an output signal substantially equal to zero when said frequency of said signal supplied to said output terminal of said controlled oscillator means is other than $f_a + n/\tau$ and said stepped phase shifter supplies a preselected phase shift that is determinable from the frequency being supplied by said controlled oscillator means; said first feedback path further including signal coupling means for coupling said signal supplied by said frequency discriminator to said frequency control terminal of said controlled oscillator means as a negative feedback signal;

a second feedback path responsive to the signal supplied by said controlled oscillator means to said output terminal thereof for supplying a feedback signal to said frequency control terminal of said controlled oscillator means, said second feedback path including means for phase-locking said controlled oscillator means at a selected carrier frequency, said means for phase-locking said controlled oscillator means including a second phase detector means having an output port and first and second input ports, said first input port of said second phase detector means being coupled to said output terminal of said controlled oscillator means for receiving a signal at a frequency dependent on the frequency of said controlled oscillator means, said second input port of said second phase detector means being connected for receiving an applied reference signal, said output port of said second phase detector means being connected for coupling a signal to said frequency control terminal of said controlled oscillator means;

a first modulation path, said first modulation path including a terminal for application of a modulating signal, said first modulation path being configured and arranged for coupling at least a portion of an applied modulation signal into said first feedback path to modulate said frequency discriminator;

a second modulation path, said second modulation path being connected to said terminal for applying a modulating signal and being configured and arranged to inject at least a portion of an applied modulation signal into said second feedback path to modulate said second phase detector;

modulation compensation means connected in at least said first modulation path, said modulation compensation means including means for adjusting the level of the modulation signal passing through said first modulation path in response to an applied error correction signal, said modulation signal passing through said first modulation path being adjusted on the basis of variations in said transfer function of said frequency discriminator relative to selected carrier frequency; and controller means responsive to an applied frequency selection signal representing a currently selected carrier frequency, said controller means including means for supplying said error correction signal to said modulation compensation means based on the value of said currently selected carrier frequency, said controller means further including means for supplying said phase step control signal to said stepped phase shift means at a value of m that permits said variable phase shifter to supply a value of $\phi_s$ that causes said frequency discriminator to supply an output signal substantially equal to zero.

2. The modulated phase-locked loop system of claim 1 wherein said second feedback path further includes a programmable frequency divider for dividing the frequency of a signal applied thereto by a selectable frequency division ratio, N, said programmable frequency divider having an input terminal coupled to the output terminal of said controlled oscillator means, said programmable frequency divider being responsive to said applied signal representative of said selected carrier frequency for establishing said value of N, said programmable frequency divider having an output terminal coupled to said first input port of said second phase detector means so that said controlled oscillator means and said second feedback path form a programmable divide-by-N phase-lock loop that is modified by said first feedback path.

3. The modulated phase-locked loop system of claim 2 wherein said modulation compensation means further includes means for adjusting the level of the modulation signal passing through said second modulation path, said modulation signal passing through said second modulation path being adjusted at least in part on the basis of said value of N.

4. The modulated phase-locked loop system of claim 3 wherein said controller means includes storage means for storing a plurality of said error correction values, means for accessing an appropriate error correction value based on the value of said currently selected carrier frequency and means for supplying that error correction value to said modulation compensation means.

5. The modulated phase-locked loop system of claims 1, 2, 3 or 4 wherein said transfer function of said noise discriminator phase detector means is substantially equal to $K_d \cos \phi$, where $K_d$ is a gain factor and $\phi$ represents the phase difference between the signals applied to said first and second input ports of said noise discriminator phase detector means, said noise discriminator phase detector means transfer function thereby being substantially equal to zero at frequencies of $f_a + n/\tau \pm \phi_e \pm m/(k\tau)$, where the algebraic sign of $\phi_e$ is determined by whether said variable phase shifter is coupled to said first input port of said noise discriminator phase detector means or said second input port thereof and the algebraic sign of the quantity $m/(k\tau)$ is determined on the basis of which of said first and second input ports of said noise discriminator phase detector means is coupled to said stepped phase shift means; said value of k effectively dividing the range of carrier frequencies supplied by said modulated phase-lock loop system into contiguous subbands each spanning a frequency interval of $1/(k\tau)$.

6. The modulated phase-locked loop system of claim 5 wherein said controller means includes means for computing a quantity representative of the subband associated with a newly selected carrier frequency, means for storing an error correction signal for each subband within the frequency range of said modulated phase-lock loop system, means for accessing a stored error correction value based on said quantity representative of the subband associated with said newly selected carrier frequency, and means for supplying said error signal to said phase compensation means.

7. The modulated phase-locked loop system of claim 6 wherein said second modulation path includes a reference oscillator having a frequency control terminal and an output terminal, said reference oscillator supplying a frequency-modulated signal having a predetermined reference center frequency, said signal passing through said second modulation path being coupled to said reference oscillator frequency control terminal to frequency modulate said reference oscillator, said output port of said reference oscillator being connected to said second input port of said second phase detector means.

8. The modulated phase-locked loop system of claim 6 wherein said second modulation path includes a signal integrator connected for receiving said modulation signal passing through said second modulation path, said signal integrator being connected for supplying a signal to said output port of said second phase detector means.

9. The modulated phase-locked loop system of claim 7 further comprising a signal-leveling loop including a variable attenuator having an input terminal, an output terminal and a control terminal, said variable attenuator supplying an amount of attenuation dependent on the value of an attenuation control signal applied to said control terminal thereof; said leveling loop further including attenuation control means connected for receiving at least a portion of the signal coupled to one of said first and second input ports of said discriminator phase detector means, said attenuation control means being connected to said control terminal of said variable attenuator, said attenuation control means including means for supplying a control signal to said variable attenuator to reduce signal attenuation when said signal coupled to said attenuation control means decreases and to supply a signal to said control terminal of said variable attenuator to increase signal attenuation when said signal received by said attenuation control means increases.

10. The modulated phase-locked loop system of claim 7 further comprising gain switching means for simultaneously decreasing the signal gain of said first and second feedback paths for a predetermined time interval whenever the signal supplied by said discriminator network is outside of a predetermined signal range, said switched gain means including signal-monitoring means for supplying a gain decrease signal whenever said signal supplied by said discriminator network is outside of said predetermined signal range; first gain control means responsive to said gain decrease signal, said first gain control means being coupled to said first feedback path and being configured and arranged to decrease the signal gain of said first feedback path while said monitoring means supplies said gain decrease signal; and second gain control means responsive to said gain decrease signal supplied by said signal-monitoring means, said second gain control means being coupled to said second feedback path and being configured and arranged to decrease the gain of said second feedback path while said signal-monitoring means supplies said gain decrease signal.

11. The modulated phase-locked loop system of claim 10 wherein said first gain control means includes a switched attenuator serially connected in said first feedback path; and wherein said second gain control means includes circuit means for establishing a low frequency pole in the response characteristic of said phase-lock loop formed by said controlled oscillator means and said second feedback path, said circuit means including switch means responsive to said gain decrease signal to establish said low frequency transmission pole only when said gain decrease signal is supplied, the frequency of said low frequency pole being established to provide a desired amount of gain decrease in said second feedback path.

12. The modulated phase-locked loop system of claim 8 further comprising a signal-leveling loop including a variable attenuator having an input terminal, an output terminal and a control terminal, said variable attenuator supplying an amount of attenuation dependent on the value of an attenuation control signal applied to said control terminal thereof; said leveling loop further including attenuation control means connected for receiving at least a portion of the signal coupled to one of said first and second input ports of said discriminator phase detector means, said attenuation control means being connected to said control terminal of said variable attenuator, said attenuation control means including means for supplying a control signal to said variable attenuator to reduce signal attenuation when said signal coupled to said attenuation control means decreases and to supply a signal to said control terminal of said variable attenuator to increase signal attenuation when said signal received by said attenuation control means increases.

13. The modulated phase-locked loop system of claim 8 further comprising gain switching means for simultaneously decreasing the signal gain of said first and second feedback paths for a predetermined time interval whenever the signal level supplied by said discriminator network is outside of a predetermined signal range, said switched gain means including signal-monitoring means for supplying a gain decrease signal whenever said signal supplied by said discriminator network is outside of said predetermined signal range; first gain control means responsive to said gain decrease signal, said first gain control means being coupled to said first feedback path and being configured and arranged to decrease the signal gain of said first feedback path while said monitoring means supplies said gain decrease signal; and second gain control means responsive to said gain decrease signal supplied by said signal-monitoring means, said second gain control means being coupled to said second feedback path and being configured and arranged to decrease the gain of said second feedback path while said signal-monitoring means supplies said gain decrease signal.

14. The modulated phase-locked loop system of claim 13 wherein said first gain control means includes a switched attenuator serially connected in said first feedback path and is activated by said gain decrease signal; and wherein said second gain control means includes circuit means for establishing a low frequency pole in the response characteristic of said phase-lock loop formed by said controlled oscillator means and said second feedback path, said circuit means including switch means responsive to said gain decrease signal to establish said low frequency transmission pole only when said gain decrease signal is supplied, the frequency of said low frequency pole being established to provide a desired amount of gain decrease in said second feedback path.

* * * * *